(12) United States Patent
Bullen

(10) Patent No.: US 10,587,221 B2
(45) Date of Patent: Mar. 10, 2020

(54) MODULAR SOLAR BATTERY

(71) Applicant: Epic Battery Inc., Fremont, CA (US)

(72) Inventor: Melvin James Bullen, Fremont, CA (US)

(73) Assignee: EPIC BATTERY INC., Fremont, CA (US)

(*) Notice: Subject to any disclaimer, the term of this patent is extended or adjusted under 35 U.S.C. 154(b) by 0 days.

(21) Appl. No.: 15/944,706

(22) Filed: Apr. 3, 2018

(65) Prior Publication Data

US 2018/0294771 A1 Oct. 11, 2018

Related U.S. Application Data

(60) Provisional application No. 62/481,075, filed on Apr. 3, 2017.

(51) Int. Cl.
*H02S 40/38* (2014.01)
*H02J 7/35* (2006.01)
(Continued)

(52) U.S. Cl.
CPC .......... *H02S 40/38* (2014.12); *H01L 31/0203* (2013.01); *H01L 31/02008* (2013.01); *H01L 31/022425* (2013.01); *H01L 31/035281* (2013.01); *H01L 31/05* (2013.01); *H01L 51/0045* (2013.01); *H01L 51/42* (2013.01); (Continued)

(58) Field of Classification Search
CPC ..... H02S 40/38; H01L 51/448; H01L 51/441; H01L 51/0045; H01L 31/035281; H01L 51/42; H01L 31/022425; H01L 31/05; H01L 31/0203; H01L 31/02008;
(Continued)

(56) References Cited

U.S. PATENT DOCUMENTS

| 389,124 A | 9/1888 | Weston |
| 1,862,559 A | 6/1932 | White |

(Continued)

FOREIGN PATENT DOCUMENTS

| CN | 106229327 A | 12/2006 |
| CN | 103481772 A | 1/2014 |

(Continued)

OTHER PUBLICATIONS

"World Solar Challenge 2017 Regulations", www.worldsolarchallenge. org, Jun. 2016.
(Continued)

*Primary Examiner* — M Baye Diao
(74) *Attorney, Agent, or Firm* — Schwabe Williamson & Wyatt, PC

(57) ABSTRACT

Described herein are apparatuses, systems, and methods for a modular solar battery (MSB). The MSB may include a solar shell that includes a solar cell, a rechargeable battery that is charged by the solar cell, and control circuitry coupled to the solar cell and/or the rechargeable battery. The MSB may be in the form of a commercial battery. The control circuitry may include circuitry for solar power optimization, information sharing, battery charging, and/or battery health monitoring. The control circuitry may include a communication circuit to communicate information about the MSB to an external device. Other embodiments may be described and claimed.

34 Claims, 10 Drawing Sheets

(51) Int. Cl.
  *H01M 10/46*      (2006.01)
  *H01L 31/02*      (2006.01)
  *H01L 31/0203*    (2014.01)
  *H01L 31/05*      (2014.01)
  *H01M 2/04*       (2006.01)
  *H01M 2/02*       (2006.01)
  *H01L 31/0224*    (2006.01)
  *H01L 51/42*      (2006.01)
  *H01L 31/0352*    (2006.01)
  *H01L 51/44*      (2006.01)
  *H01L 51/00*      (2006.01)

(52) U.S. Cl.
  CPC .......... *H01L 51/441* (2013.01); *H01L 51/448* (2013.01); *H01M 2/022* (2013.01); *H01M 2/0267* (2013.01); *H01M 2/04* (2013.01); *H01M 10/465* (2013.01); *H02J 7/35* (2013.01); *H02J 7/355* (2013.01); *Y02E 10/566* (2013.01)

(58) Field of Classification Search
  CPC .. H01M 2/0267; H01M 10/465; H01M 2/022; H01M 2/04; H02J 7/35
  USPC .......................................................... 320/101
  See application file for complete search history.

(56) References Cited

U.S. PATENT DOCUMENTS

| | | | |
|---|---|---|---|
| 2,396,419 | A | 3/1946 | Hassel |
| D171,628 | S | 3/1954 | Weddell |
| 3,123,321 | A | 3/1964 | Custer |
| 3,696,283 | A | 10/1972 | Ackley, III |
| 4,083,097 | A | 4/1978 | Anagnostou |
| 4,170,507 | A | 10/1979 | Keeling |
| 4,374,955 | A | 2/1983 | Gupta |
| 4,383,129 | A | 5/1983 | Gupta |
| 4,563,727 | A | 1/1986 | Curiel |
| 4,592,436 | A | 6/1986 | Tomei |
| 4,692,557 | A | 9/1987 | Samuelson |
| 4,832,755 | A | 5/1989 | Barton |
| 4,857,095 | A | 8/1989 | Brown |
| 5,138,699 | A | 8/1992 | Minor |
| 5,202,211 | A | 4/1993 | Vercoulen |
| 5,238,674 | A | 8/1993 | Vercoulen |
| 5,273,608 | A | 12/1993 | Nath |
| 5,608,385 | A * | 3/1997 | Masaki ................... H02S 50/10 320/101 |
| 5,668,424 | A | 9/1997 | Lamb |
| 5,848,904 | A * | 12/1998 | Kikuchi ................ G03B 17/02 439/136 |
| 6,005,317 | A | 12/1999 | Lamb |
| 6,042,806 | A | 3/2000 | Bedard |
| 6,078,165 | A | 6/2000 | Ashtiani |
| 6,204,139 | B1 | 3/2001 | Liu |
| 6,268,059 | B1 | 7/2001 | Cronin |
| 6,366,739 | B1 * | 4/2002 | Yoshihara ............. G03B 17/55 136/245 |
| 6,551,741 | B1 | 4/2003 | Hamada |
| 6,660,930 | B1 | 12/2003 | Gonsiorawski |
| 6,668,444 | B2 | 12/2003 | Ngo |
| 6,685,882 | B2 | 2/2004 | Deevi |
| 6,745,977 | B1 | 6/2004 | Long |
| D630,162 | S | 1/2011 | Bullen |
| 8,373,191 | B2 | 2/2013 | Ide |
| 8,421,400 | B1 | 4/2013 | Khanna |
| 8,487,778 | B2 * | 7/2013 | Kang ................... H01M 10/465 320/101 |
| 8,505,351 | B2 | 8/2013 | Klatt |
| 8,531,152 | B2 | 9/2013 | Blau |
| 8,629,646 | B2 | 1/2014 | Bullen |
| 8,701,800 | B2 | 4/2014 | Hui |
| 8,753,918 | B2 | 6/2014 | Varghese |
| 8,851,560 | B1 | 10/2014 | Freeman |
| 8,946,113 | B2 | 2/2015 | Moon |
| 9,054,249 | B2 | 6/2015 | Chaudhari |
| 9,543,537 | B2 | 1/2017 | Steirer |
| 9,608,159 | B2 | 3/2017 | Chaudhari |
| 10,340,458 | B2 * | 7/2019 | Gong .................. H01L 51/4273 |
| 2002/0086446 | A1 | 7/2002 | Charpentier |
| 2005/0133085 | A1 | 6/2005 | Shimada |
| 2005/0243345 | A1 | 11/2005 | Foehr |
| 2006/0253356 | A1 | 11/2006 | Charles |
| 2007/0007240 | A1 | 1/2007 | Wise |
| 2007/0087266 | A1 | 4/2007 | Bourke |
| 2007/0273327 | A1 | 11/2007 | Daniel |
| 2008/0235156 | A1 | 9/2008 | Amodeo |
| 2009/0053511 | A1 | 2/2009 | Kim |
| 2009/0288890 | A1 | 11/2009 | Freeman |
| 2009/0309893 | A1 | 12/2009 | Boothroyd |
| 2010/0096004 | A1 | 4/2010 | Hu |
| 2010/0173188 | A1 | 7/2010 | Dhawan |
| 2010/0193260 | A1 | 8/2010 | Freeman |
| 2010/0198754 | A1 | 8/2010 | Jones |
| 2010/0235219 | A1 | 9/2010 | Merrick |
| 2010/0320958 | A1 | 12/2010 | Kawitt |
| 2011/0129676 | A1 | 6/2011 | Bravet |
| 2011/0146794 | A1 | 6/2011 | Tsai |
| 2011/0200867 | A1 | 8/2011 | Culver |
| 2011/0297459 | A1 | 12/2011 | Hayek |
| 2012/0028098 | A1 | 2/2012 | Meehan |
| 2012/0060910 | A1 | 3/2012 | Schoenfeld |
| 2012/0070934 | A1 | 3/2012 | Mitra |
| 2012/0080753 | A1 | 4/2012 | Singh |
| 2012/0183832 | A1 | 7/2012 | Culver |
| 2012/0186623 | A1 | 7/2012 | Bulovic |
| 2012/0229067 | A1 | 9/2012 | Barbero |
| 2013/0043826 | A1 | 2/2013 | Workman |
| 2013/0099765 | A1 | 4/2013 | Girard |
| 2013/0126666 | A1 | 5/2013 | Brown |
| 2013/0236764 | A1 | 9/2013 | Hu |
| 2014/0093734 | A1 | 4/2014 | Mogi |
| 2014/0130864 | A1 | 5/2014 | Lunt |
| 2014/0252342 | A1 | 9/2014 | Ramadas et al. |
| 2014/0283896 | A1 | 9/2014 | Lunt, III |
| 2015/0053258 | A1 | 2/2015 | Beck |
| 2015/0060743 | A1 | 3/2015 | Yashima |
| 2015/0144196 | A1 | 5/2015 | Irwin |
| 2015/0199062 | A1 | 7/2015 | Lang |
| 2015/0256026 | A1 | 9/2015 | Rybkiewicz |
| 2015/0311504 | A1 | 10/2015 | Hong et al. |
| 2015/0345006 | A1 | 12/2015 | Uprety |
| 2016/0133672 | A1 | 5/2016 | Koposov |
| 2016/0163904 | A1 | 6/2016 | Mailoa |
| 2016/0176256 | A1 | 6/2016 | Gandhi |
| 2016/0289671 | A1 | 10/2016 | Ozcan |
| 2016/0322172 | A1 | 11/2016 | Chaudhari |
| 2016/0322509 | A1 | 11/2016 | Singh |
| 2016/0339160 | A1 | 11/2016 | Bedworth et al. |
| 2016/0351841 | A1 | 12/2016 | Suzuka |
| 2017/0018372 | A1 | 1/2017 | Fujimura |
| 2017/0084400 | A1 * | 3/2017 | Cheng ................ H01L 51/0003 |
| 2017/0104440 | A1 | 4/2017 | Sakabe et al. |
| 2017/0125172 | A1 * | 5/2017 | Gong .................. H01L 51/0007 |
| 2017/0309407 | A1 * | 10/2017 | Suzuka ................ H01G 9/2059 |
| 2018/0010039 | A1 * | 1/2018 | Dong ..................... C09K 11/06 |
| 2018/0175112 | A1 * | 6/2018 | Robinson .............. H01L 27/302 |
| 2018/0244160 | A1 | 8/2018 | Bullen |
| 2019/0006547 | A1 * | 1/2019 | Watts ................ B32B 17/10036 |

FOREIGN PATENT DOCUMENTS

| | | |
|---|---|---|
| CN | 205452361 U | 8/2016 |
| EP | 2523246 A1 | 11/2012 |
| EP | 2634146 A1 | 9/2013 |
| EP | 2693503 A1 | 2/2014 |
| WO | 1998/057414 A1 | 12/1998 |
| WO | 2001/072652 A1 | 10/2001 |
| WO | 2005/060624 A2 | 7/2005 |
| WO | 2013/119113 A1 | 8/2013 |
| WO | 2014/045021 A1 | 3/2014 |
| WO | 2014/097299 A1 | 6/2014 |

(56) References Cited

FOREIGN PATENT DOCUMENTS

| WO | 2015/031944 A1 | 3/2015 |
| --- | --- | --- |
| WO | 2016/152704 A1 | 9/2016 |
| WO | 2018/156987 A1 | 8/2018 |
| WO | 2018/187384 A1 | 10/2018 |
| WO | 2018/191756 A2 | 10/2018 |

OTHER PUBLICATIONS (A) Wikipedia, "Artificial Sunlight," retrieved from the Internet on Sep. 27, 2016; 3 pages.
(B) Meek, et al. "Clothoid Spline Transition Spirals" Mathematics of Computation, vol. 59, No. 199; Jul. 1992; pp. 117-133.
(C) Liu et al., "Figure 1: Device architecture and energy-level diagram" Nature Photonics 8, (2014); 3 pages.
(D) Dyesol Materials Catalogue (2016); 44 pages; retrieved from the Internet from <http://3d-nano.com/wp-content/ uploads/2016/09/Dyesol-Material-Catalogue.pdf>.
(E) Petropoulos, et al., "Beyond Fick: How Best to Deal with non-Fickian Behavior in a Fickian Spirit" Diffusion—rundamentals.org 11 (2009) 5; 21 pages.
(F) Gehlhaar et al., Solar & Alternative Energy Perovskite solar modules with minimal area loss interconnections; Oct. 29, 2015 SPIE Newsroom. Retrieved from the Internet from http://spie.org/newsroom/6116-perovskite-solar-modules-with-minimal-area-loss-interconnections? ArticleID=x115669>.
(G) Zhang et al., "Highly Efficient Perovskite Solar Cells with Tunable Structural Color"; Nano Letters (2015) vol. 15:1698-1702; DOI: 10.1021/nl504349z.
(H) "Perovskites and Perovskite Solar Cells: An Introduction" Ossila Ltd.; 10 pages; downloaded from the Internet on Oct. 5, 2016 from <http://localhost/Users/jamie/Solarjoos/patents/stable%20perovskite/technical%JOdocumentation/Perovskites%20and%20Perovskite%20Solar"/o20Cells_%20An%1ntroduction%20%E2%80%93%JOOssila.html>.
(I) Wikipedia, "Perovskite solar cell," retrieved from the Internet on Sep. 26, 2016; 14 pages.
(L) Wikipedia, "Polycarbonate", retrieved from the Internet Sep. 26, 2016; 10 pages.
(J) Jordan et al. "Photovoltaic Degradation Rates—An Analytical Review," National Renewable Energy Laboratory, Journal article NREUJA-5200-51664; Jun. 2012; 32 pages; available electronically at <http://www.osti.gov/bridge>.
(K) Mitsubishi Engineering-Plastics Corporation; Physicality catalog Chapter 6 "Chemical Properties"; 10 pages; Downloaded from the Internet at <https:lwww.m-ep.eo.jp/en/pdf/product/iupi_ nova/physicality_06.pdf>.
(M) E Ink Triton "Imaging Film" Technical Spec Sheet; 1 page; retrieved from the Internet on Sep. 4, 2016 from <http://www2.eink.com/sell_sheets/triton_spec_sheet.pdf>.
"Magnet" from Wikipedia <https://en.wikipedia.org/wiki/magnet>.
"Magnetic Core" from Wikipedia <https://en.wikipedia.org/wiki/Magnetic_core>.
"Neodymium Magnet" from Wikipedia <https://en.wikipedia.org/wiki/Neodymium_magnet>.
Albrecht, et al. "Towards optical optimization of planar monolithic perovskite/silicon-heterojunction tandem solar cells", IOPscience, 2016.
Amadeo "Project Ara—Google's modular smartphone—is dead", ARS Technical <www.arstechnica.com>, Sep. 1, 2016.
Azzolini, "Production and Performance of Cu-based anode-supported tubular IT-SOFCs", University of Trento; Doctoral School of Material Science and Engineering, Dec. 2014.
Berman, "Where's the Affordable Carbon Fiber Automobile?" Sustainable Energy, MIT Technology Review, Aug. 10, 2015, 6 pages.
Boudouris, "Organic Electron Devices", Lecture segment; Nano Hub, Purdue University, Jan. 2015.
Bullis "A Battery to Prop Up Renewable Power Hits the Market", Downloaded from the Internet at <https://www.technologyreview.com/s/532311/a-battery-to-prop-up-renewable-power-hits-the-market> Nov. 14, 2014.
Casey "New 'Super Battery' Energy Storage Breakthrough Aims at $54 per kWh", downloaded from the Internet at <https://cleantechnica.com/2016/02/26/new-energy-storage-solution-could-hit-magic-54-mark> Feb. 26, 2016.
Chi et al., "Battery Charge Depletion Prediction on an Electric Aircraft", NASA Langley Research Center, 2013.
Choi et al. "Conjugated polyelectrolyte hole transport layer for inverted-type perovskite solar cells", Nature Communications, vol. 6, issue 7348, Jun. 17, 2015, 6 pages.
Copper Development Association "A Guide to Working with Copper and Copper Alloys", Antimicrobial Copper, Copper Development Association A1360 XX/10, 2017.
De Almeida et al. "VSDs for Electric Motor Systems", University of Coimbra, 2016.
De Looper "Need More Battery on Your Apple Watch?" Downloaded from the Internet at <www.digitaltrends.com/wearables/apple-watch-modular-bands> Mar. 31, 2016.
DuPont Creative Mechanisms, "Everything You Need to Know About Polycarbonate," 2015; retrieved from the internet on Sep. 26, 2016 from https://www.creativemechanisms.com/blog/everything-you-need-to-know-about-polycarbonate-pc.
DuPont USA, DuPont Frontsheet Materials, DuPont Teflon Films {Teflon Fluoropolymer), 2015; K23269 Sep. 2009; 4 pages.
Electronic paper, Wikipedia, downloaded from the Internet at <https://en.wikipedia.org/wiki/Electronic_paper> 2016.
Eperon et al. "Inorganic caesium lead iodide perovskite solar cells", Royal Society of Chemistry, The Journal of Materials Chemistry, vol. 3 (2015): 19688-19695.
Eveready 1209 Product Datasheet, Form No. EBC-3107F, www.energizer.com (2017); 2 pages.
Fan et al., Microelectronics Reliability, "Experimental investigations and model study of moisture behaviors in polymeric materials," vol. 49, Issue 8, Aug. 2009; 12 pages.
Galvanic corrosion', Wikipedia, downloaded from the Internet at <https://en.wikipedia.org/wiki/Galvanic_corrosion> 2015.
Green Hills, Inc., "Integrity Real-Time Operating System", 2015, retrieved from the Internet on Oct. 2, 2016 from http://www.ghs.com/products.rtos.integrity.html; 4 pages.
Honeywell Aclar® Films, "Honeywell Aclar® UltRx6000", effective date Sep. 19, 2011; 1 page.
International Search Report and Written Opinion for PCT/US2018/019566 dated Jun. 26, 2018; 8 pages.
Jeffrey, "Siemens' world-record electric aircraft motor punches above its weight", blog-New Atlas, Apr. 2015, 4 pages.
Jiang, et al., "Modeling charge polarization voltage for large lithium-ion batteries in electric vehicles", Journal of Industrial Engineering and Management, vol. 6, No. 2 (2013); 686-697.
Johnson, "Nanotube based Li-Ion Batteries Can Charge to Near Maximum in Two Minutes", IEEE Spectrum, blog, Oct. 2014.
Jung et al. "Substantial improvement of perovskite solar cells stability by pinhole-free hole transport layer with doping engineering", Scientific Reports, vol. 5, May 2015; 5 pages.
Kato et al. "Silver Iodide Formation in Methyl Ammonium Lead Iodide Perovskite Solar Cells with Silver Top Electrodes", Advanced Materials Interfaces, vol. 2 (2015), 6 pages.
Kempe et al., National Renewable Energy Laboratory, "Calcium Based Test Method for Evaluation of Photovoltaic Edge-Seal Materials," 2011 NREL PV Module Reliability Workshop; Feb. 16, 2011; 21 pages.
Krings, "Iron Losses in Electrical Machines—Influence of Material Properties, Manufacturing Processes, and Inverter Operation", KTH School of Electrical Engineering, Doctoral Thesis, 2014; 177 pages.
Lee et al. "Neutral- and Multi-Colored Semitransparent Perovskite Solar Cells", MDPI, Molecules, vol. 21, issue 4 (2016), 55 pages.
Li et al. "High-efficiency robust perovskite solar cells on ultrathin flexible substrates", Nature Communications, 7:10214, Jan. 2016.
LR44 Technical Data Sheet, Renata Batteries Inc., 2002; 1 page.

(56) References Cited

OTHER PUBLICATIONS

Luomi, "Efficiency Optimization of a 100-W, 500 000-rpm Permanent-Magnet Machine Including Air Friction Losses", IEEE vol. 45, No. 4, Jul./Aug. 2009; 1368-1377.
Lyu, et al. "Organic-inorganic bismuth (III)-based material: a lead-free, air-stable and solution-processable light-absorber beyond organolead perovskites", Tsinghua University Press, Nano Research, Nov. 2015.
Maxim, MAX1740 Data Sheet "SIM/Smart Card Level Translators in μMAX," 19-1458; 19-1458: Rev O; 1/00; 2000; 12 pages.
Microchip, Inc., "PIC32MZ Embedded Connectivity with Floating Point Unit {EF} Family," Technical Documentation; J015; 736 pages. (uploaded in multiple parts).
Moldovan et al., "A New 94-GHz Six-Port Collision-Avoidance Radar Sensor", IEEE vol. 52, No. 3, Mar. 2004; 751-759.
Organic electronics, Wikipedia, downloaded from the Internet at <https://en.wikipedia.org/wiki/Organic-electronics> 2016.
Patent Cooperation Treaty: International Search Report and Written Opinion for PCT/US2018/025964 dated Aug. 28, 2018; 15 pages.
Patent Cooperation Treaty: International Search Report and Written Opinion for PCT/US2018/027827 dated Aug. 27, 2018; 16 pages.
Penn Stainless "Duplex 2507 Specifications: UNS S32750", downloaded from the Internet at <www.pennstainless.com> 2016.
Power Stream Technology, American Wire Gauge "Wire Gauge and Current Limits Including Skin Depth and Strength" Nov. 12, 2015; 6 pages.
Rosu-Hamzescu et al., "Practical Guide for Implementing Solar Panel MPPT Algorithms" Microchip Inc., 2013; 16 pages.
Rudati et al. "The I-V characteristics of organic hole-only devices based on cross-linked hole-transport layer", www.sciencedirect.com, Journal of Applied Research and Technology, vol. 13 (2015): 253-260.
Schwartz, "New perovskite solar cell design could outperform existing commercial technologies, Stanford and Oxford scientists report", www.news.stanford.edu, Oct. 2016; retrieved from the Internet at <https://news.stanford.edu/2016/10/20/perovskite-solar-cell-design-shows-promise/>.
Screw threads', Wikipedia, downloaded from the Internet at <https://en.wikipedia.org/wiki/Screw_thread#Thread_Limit> 2015.
Specification for Lithium Battery, Model: CR2032 Product Specification; Power Glory Battery Tech (HK) Co., Ltd., 2012; 9 pages.
Stanford News, "New perovskite solar cell design could outperform existing commercial technologies, Stanford and Oxford scientists report," Oct. 2016; retrieved from the internet on Nov. 7, 2016 from <http://news.stanford.du/2016/10/20/perovskite-solar-cell-design-shows-promise>.
Sun et al. "Discovering lead-free perovskite solar materials with a split-anion approach", Royal Society of Chemistry, Nanoscale, Issue 12, 2015.
Suttman Lithium Ion Battery Aging Experiments and Algorithm Development for Life Estimation, Thesis—Ohio State University, 2011.
Synchronous Optical Network (SONET) Tutorial, Tektronix, 1998 <http://www.webproforum.com/tektronix/full.html>.
Thales "Modular Universal Battery Charger", downloaded from the Internet at <www.thalescomminc.com> 2015.
The Orange solar charger by JOOS; 6 pages; downloaded from the Internet on Apr. 25, 2018 at <http://solarjoos.com/ products>.
Tyva Moduloo Inc. "New generation of modular lithiumion polymer batteries", downloaded from the Internet at <http://www.tyva-ennergie.com/en/moduloo-en/home.html>, 2016.
Valence "Valence Technology: The first scalable large lithium ion battery pack", downloaded from the Internet at <https://www.valence.com/why-valence/modular> 2016.
VanZwol "Designing Battery Packs for Thermal Extremes", Power Electronics, downloaded from the Internet at <http://powerelectronics.com/print/mobile/designing-battery-packs-thermal-exremes> 2016.
Veldhuis et al. "Perovskite Materials for Light-Emitting Diodes and Lasers", ResearchGate, Advanced Materials, vol. 28 (2016); 6804-6834.
Wikipedia, "Fick's Laws of Diffusion," 1855; retrieved from the Internet on Oct. 5, 2016; 11 pages.
Wikipedia, "Shockley-Queisser Limitation," 1961; retrieved from the Internet on Sep. 26, 2016; 14 pages.
Zhao et al. "Is Cu a stable electrode material in hybrid perovskite solar cells for a 30 year lifetime?" Energy & Environmental Science, vol. 9 (2016): 3650-3656.

\* cited by examiner

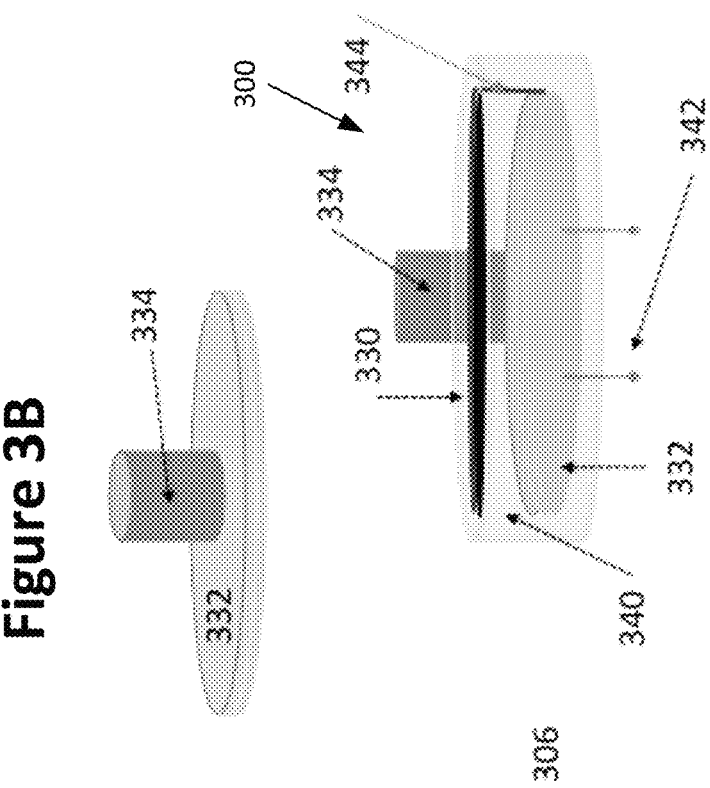
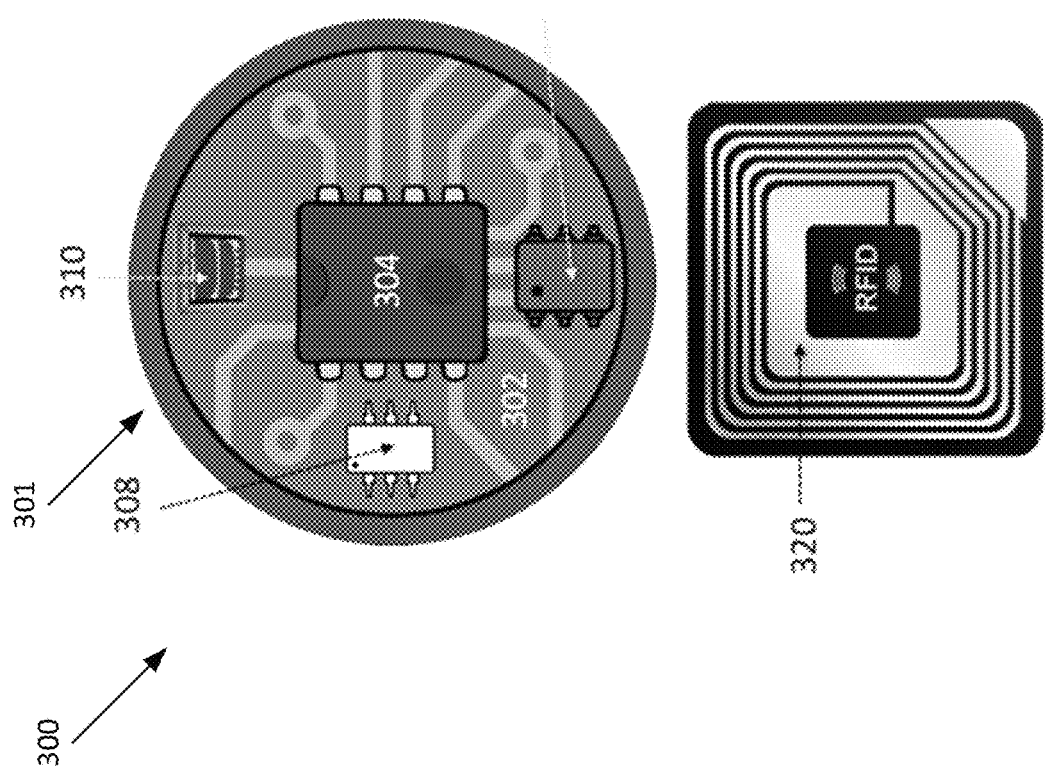

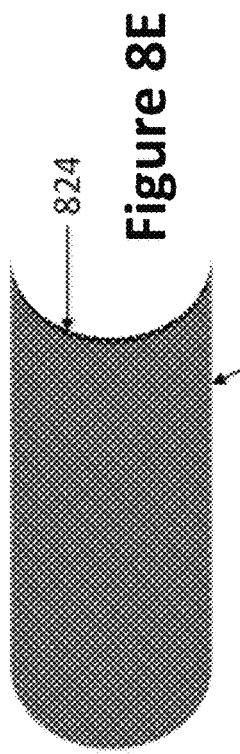
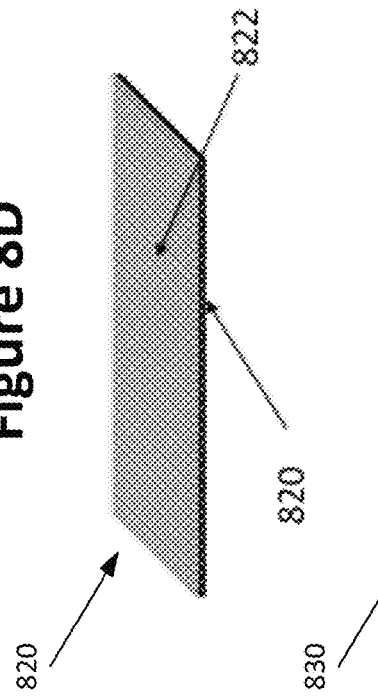
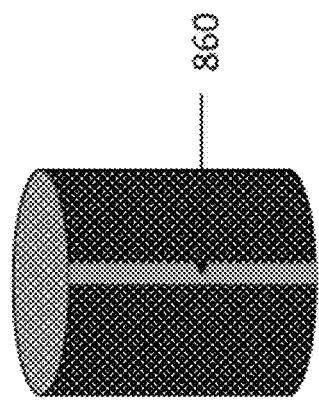
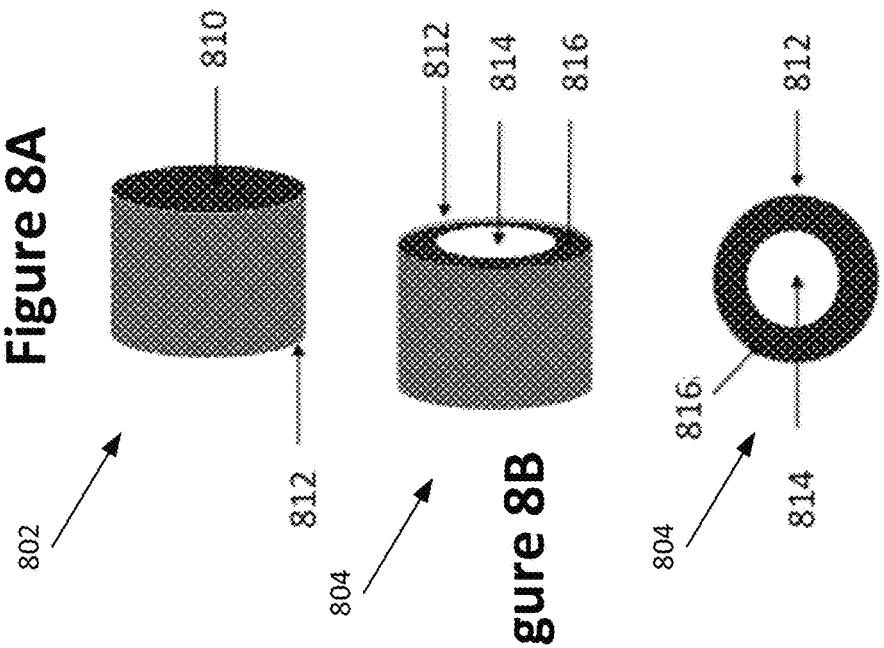
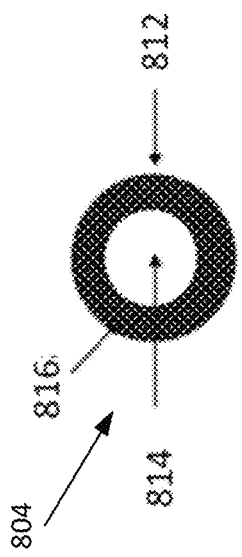
Figure 8A Figure 8B Figure 8C Figure 8D Figure 8E Figure 8F

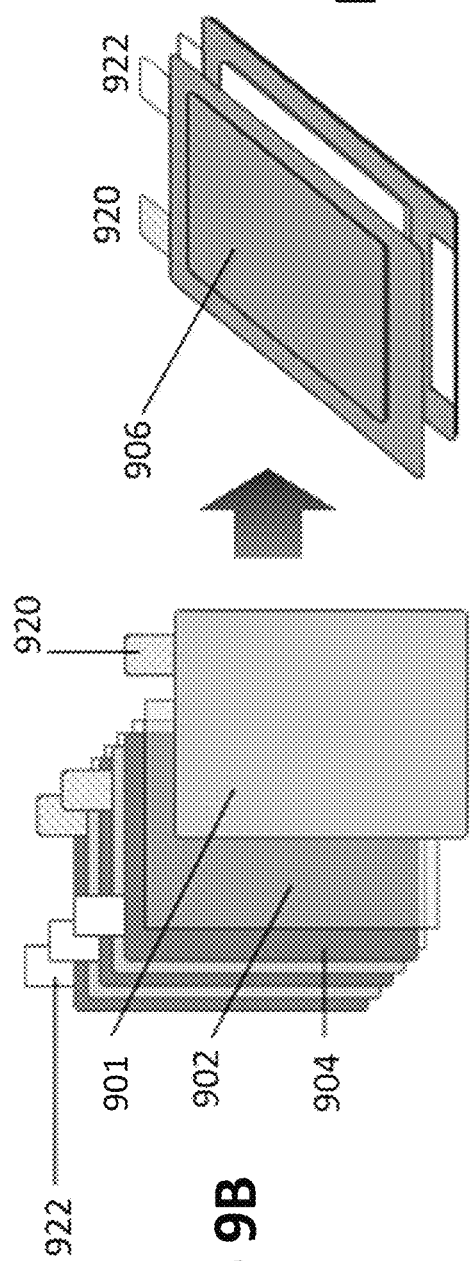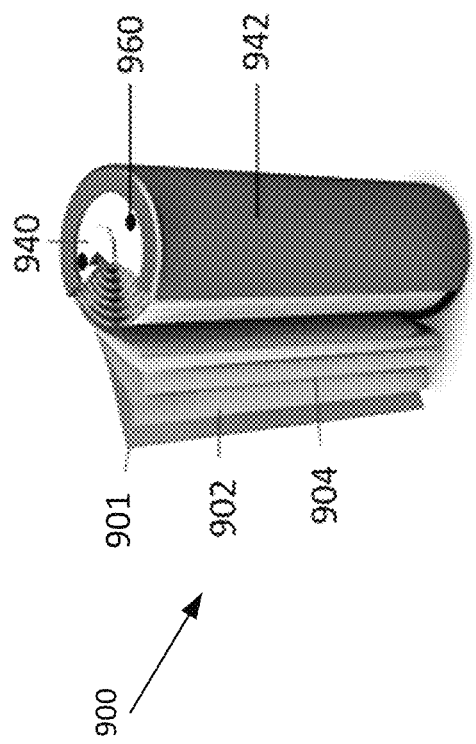

MODULAR SOLAR BATTERY

CROSS REFERENCE TO RELATED APPLICATION

The present application claims priority to U.S. Provisional Patent Application No. 62/481,075, filed Apr. 3, 2017, which is hereby incorporated by reference.

TECHNICAL FIELD

Embodiments herein relate to the field of solar cells and, specifically, to modular solar batteries.

BACKGROUND

Solar cells harvest solar energy from the sun and convert it to electrical energy. The electrical energy can be stored in batteries to enable use of the stored electrical energy to provide electrical power at a different time or location. Some systems include rigid, flat solar cells to charge external batteries.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

FIG. 3A illustrates a top down view of components of an electronics assembly including control circuitry, in accordance with various embodiments.

FIG. 3B illustrates a perspective view of a control circuitry in accordance with various embodiments.

FIG. 3C illustrates an assembled electronics assembly in accordance with various embodiments.

FIGS. 8A, 8B, 8C, 8D, 8E, and 8F illustrate material compositions that may be used in an MSB, according to various embodiments.

FIG. 9A illustrates a rechargeable battery 900 that may be used in an MSB, in accordance with various embodiments.

FIGS. 9B and 9C show additional views of disassembled components of the battery of FIG. 9A.

DETAILED DESCRIPTION OF DISCLOSED EMBODIMENTS

Figure 1:
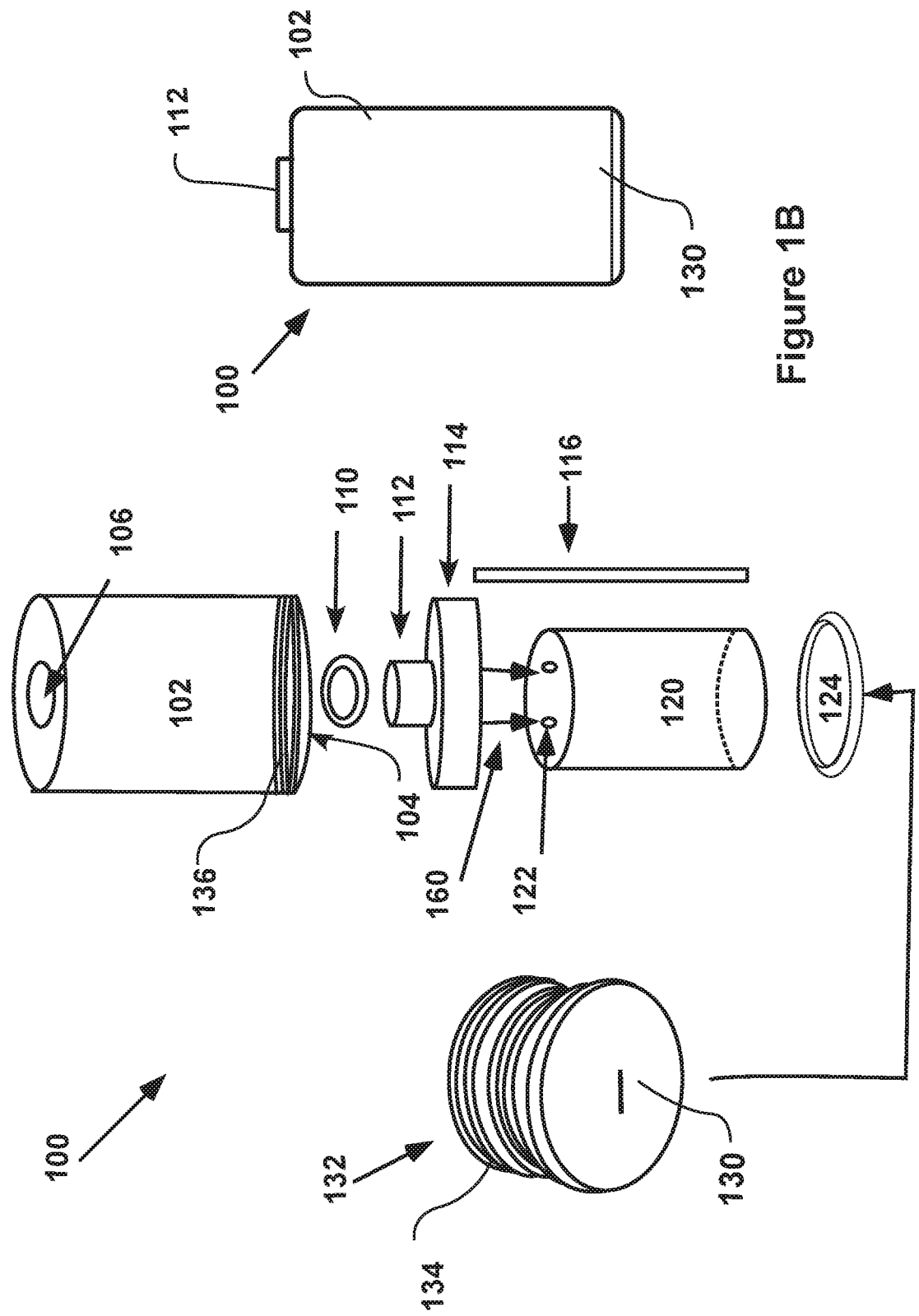
FIG. 1A illustrates an exploded view of a modular solar battery (MSB), in accordance with various embodiments.
FIG. 1B illustrates the MSB of FIG. 1A when assembled, in accordance with various embodiments.

In the following detailed description, reference is made to the accompanying drawings, which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense.

Various operations may be described as multiple discrete operations in turn, in a manner that may be helpful in understanding embodiments; however, the order of description should not be construed to imply that these operations are order-dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to," the term "having" should be interpreted as "having at least," the term "includes" should be interpreted as "includes but is not limited to," etc.).

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, an embedded computer, and so forth.

Described herein are apparatuses, systems, and methods for a modular solar battery (MSB). The modular solar battery may include a solar shell that includes a photovoltaic device (e.g., solar cell). The solar shell may form the exterior surface of the MSB, and may be manufactured in the physical form factor of a consumer battery. For example, the solar shell may have a cylindrical shape, a rectangular shape (e.g., a rectangular parallelepiped with curved edges, such as for a 6-volt or 9-volt commercial battery), or another suitable shape. The MSB may further include a rechargeable battery coupled to the solar cell to store electrical energy harvested by the solar cell. The rechargeable battery may be disposed in an open interior region of the solar shell. The MSB may further include control circuitry coupled to the solar shell and/or the rechargeable battery. The rechargeable battery may also be disposed in the open interior region of the solar shell. An anode and a cathode of the MSB may be exposed externally to provide electrical power to a battery-powered device.

In some embodiments, the rechargeable battery may be removable from the interior region of the solar shell. For example, the MSB may include a battery cap that is at least partially removable from the solar shell to expose the interior region of the solar shell and enable removal of the rechargeable battery. In some embodiments, the battery cap may include the cathode and/or the anode of the MSB. The usable lifetime of the rechargeable battery may be significantly shorter than the usable lifetime of the solar shell and/or control circuitry. Accordingly, the rechargeable battery may be removed and replaced with a new rechargeable battery for use with the same solar shell.

The solar cell may generate a voltage between the anode and the cathode in response to solar energy. The solar cell may be a single junction cell, a multi-junction cell, or a tandem cell. A multi-junction cell may include two or more p-n junctions of different materials. A tandem cell may include two or more p-n junctions of the same materials.

The solar shell and/or the included solar cell described herein may be formed with many different shapes and/or form factors, and may be used for several different intended uses. Examples of solar cells with this capability are perovskite (e.g., rigid perovskite), cadmium telluride thin-films, CIGS thin-films, amorphous thin-films, and others. The rechargeable battery of the MSB is coupled to the solar cell to store electrical energy harvested by the solar cell.

The control circuitry of the MSB may be coupled to the solar cell. In some embodiments, the control circuitry may be additionally or alternatively coupled to the rechargeable battery, and/or the anode and/or cathode of the MSB. The control circuitry may, for example, keep solar power generation on the maximum power point, perform battery management, determine the battery's health, and provide information about the device's status. In some embodiments, the control circuitry may be potted circuitry. Potting is a process of filling a complete electronic assembly with a compound for resistance to shock, vibration, moisture exclusion, and resistance to corrosive agents. In some embodiments, the potting compound may be thermosetting silicone rubber gel.

Various embodiments also provide a material structure that may be used for one or more conductive components of the MSB, such as the solar cell anode, the battery anode, the battery cathode, the MSB anode, the MSB cathode, and/or one or more conductive connections. The material structure may include a first layer and a second layer coupled to one another (also referred to as a base layer and a layer on the base layer). In some embodiments, the first layer and/or the second layer may be a monolayer that is a single atomic or molecular layer (e.g., one atom or molecule thick). The combination of the first and second layer may be selected to provide the material structure with an extremely low or zero resistance (e.g., a superconductor). Although the material structure may be described herein as a superconductor with zero resistance, it is acknowledged that in practical use the material structure may have a finite, small resistance, e.g., due to manufacturing defects and/or other factors.

In some embodiments, the first layer may include a hexagonal atomic structure that facilitates the superconducting quality when coupled with a suitable second layer (e.g., monolayer). Example first layers with a hexagonal atomic structure and a suitable second layer may include, but are not limited to, graphene and tin (making stanene), germanene (hexagonal version of germanium) and graphene or molybdenum disulfide, silicene (hexagonal version of silicon) and silver, graphene and praseodymium cerium copper oxide (PCCO) and/or $Pr_{2-x}Ce_xCuO_4$ (where x is non-zero), boron with a hexagonal atomic structure and silver, and phosphorus with a hexagonal atomic structure and silver.

Figure 7:
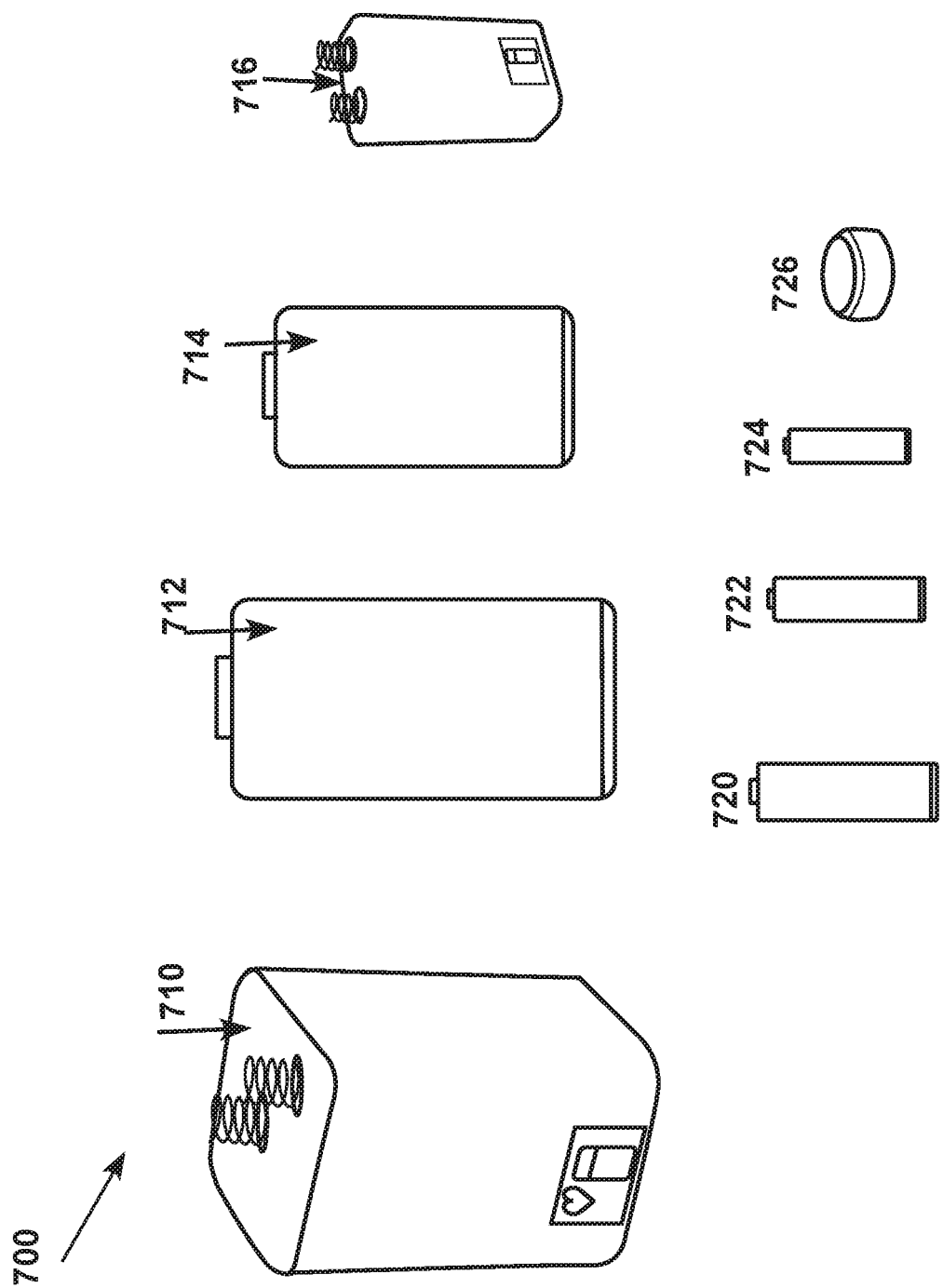
FIG. 7 illustrates a family of MSBs, in accordance with various embodiments.

FIG. 1A illustrates an exploded view of a MSB 100, in accordance with various embodiments. FIG. 1B illustrates the MSB 100 when assembled, in accordance with various embodiments. The MSB 100 shown in FIGS. 1A and 1B is a commercial size D battery. However, it will be apparent that other embodiments of the MSB 100 may be in other form factors, e.g., commercial battery form factors. Some non-limiting examples of various form factors for the MSB are shown in FIG. 7. The components of the MSB 100 may be the same or similar for other form factors. In some embodiments, modifications may be made to one or more of the components, e.g., depending on the size of the MSB 100.

In various embodiments, the MSB 100 may include a solar shell 102, a battery 120, an anode 112, and a cathode 130. The MSB 100 may further include an electronic assembly 114 that includes control circuitry. The solar shell 102 may have a three-dimensional shape with an open interior region. The anode 112 may extend through an opening 106 in the solar shell 102 (e.g., in the top surface of the solar shell 102) and may be exposed outside of the solar shell 102. The electronic assembly 114 may be coupled to the anode 112 and may be disposed inside the solar shell 102. In some embodiments, a gasket 110 may be around the opening 106 inside the solar shell 102 (e.g., to provide a secure, watertight and/or shock-absorbing fit for the electronic assembly 114. In some embodiments, the anode 112 may be permanently coupled to the electronic assembly 114, as shown in FIG. 1. Furthermore, the anode 112 and/or electronic assembly 114 may be removably or permanently coupled to the solar shell 102.

In various embodiments, the battery 120 may be disposed in the interior region of the solar shell 102 when the MSB 100 is assembled. The battery 120 may be any suitable type of rechargeable battery, such as a lithium ion battery, etc. The battery 120 may be conductively coupled to the electronic assembly 114. For example, the battery 120 may include one or more contacts 122 to conductively couple with one or more contacts 160 of the electronic assembly 114. The contacts 122 may be conductively coupled to a battery anode and a battery cathode of the battery 120 (e.g., as shown for battery 900 in FIG. 9). In some embodiments, the contacts 122 may be female connection pins that engage with male connection pins of the electronic assembly 114. In other embodiments, the contacts 122 may be male connection pins and/or may include one female connection pin and one male connection pin (e.g., to help ensure that the battery is correctly aligned in the MSB 100).

In various embodiments, the battery 120 may be removable from the solar shell 102 (e.g., via opening 104 in the solar shell 102). A battery cap 130 may be inserted in the opening 104 to hold the battery 120 inside the solar shell 102. In some embodiments, the battery cap 130 may include the cathode 132 of the MSB 100. In other embodiments, the cathode 132 may be permanently or removably coupled to another portion of the solar shell 102, and/or the battery cap 130 may not include the cathode 132. In some embodiments, the electronic assembly 114 may also be removable and replaceable.

It may be important that the battery is inserted in the correct orientation to prevent damage to the control circuitry 114. Accordingly, in some embodiments, the MSB 100 may include an alignment strip 116 to facilitate proper alignment of the rechargeable battery 120 (e.g., to align the contacts 122 of the rechargeable battery 120 with the corresponding contacts of the control circuitry 114). The battery 120 may include a notch in the side surface of the battery 120 that engages with the alignment strip 116 to ensure proper alignment of the battery 120. In other embodiments, the battery 120 may include a strip that engages with a notch on the inner surface of the solar shell 102. Alternatively, or additionally, the contacts 122 of the battery 120 and/or the corresponding contacts of the control circuitry 114 may be designed to only enable the battery 120 to be coupled with the control circuitry 114 and/or fully inserted into the interior region of the solar shell 102 with the proper alignment. Alternatively, or additionally, the shape of the battery 120 and/or the solar shell 102 (e.g., having a non-circular and/or asymmetrical cross-sectional shape) may only permit insertion of the battery 120 in the correct orientation. It will be apparent that other alignment mechanisms may be used.

In various embodiments, the battery cap 132 may include a mating feature 134 to engage with a mating feature 136 of the solar shell 102 to removably couple the battery cap 132 to the solar shell 102. In some embodiments, the mating features 134 and 136 may include screw threads, as shown in FIG. 1A. The screw threads in the mating feature 136 of the solar shell 102 may be formed in the outer encapsulation layer of the solar shell 102 or provided by affixing another component with screw threads (e.g., a bushing) into the opening 104 of the solar shell 102. It will be apparent that other mating features 134 and/or 136 may be used, such as a snap-in feature or another technique. For example, screw threads may not be suitable for MSBs that are not cylindrical. In some embodiments, a gasket 124 (e.g., silicone gasket) may be provided between the battery 120 and the battery cap 132.

Figure 5:
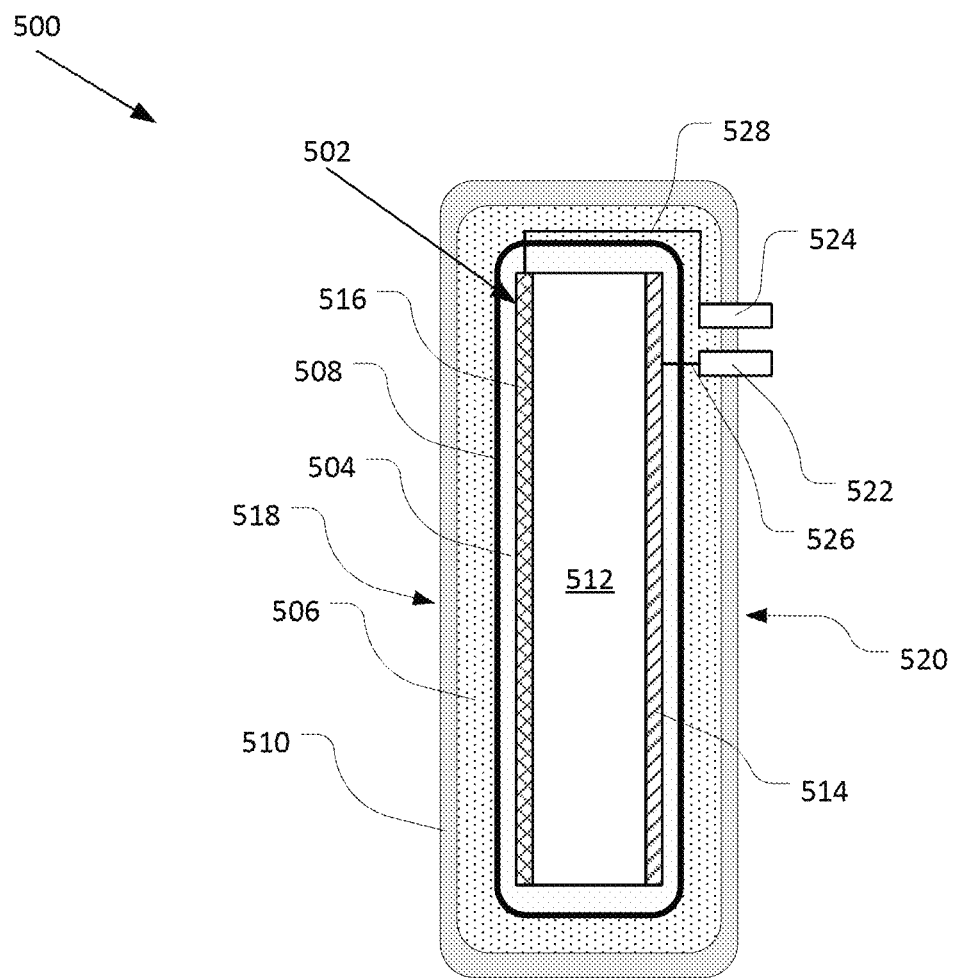
FIG. 5 illustrates a cross-sectional side view of a solar shell including a meta-encapsulated solar cell, in accordance with various embodiments.

In various embodiments, the solar shell 102 may include a solar cell with a photovoltaic material, and a solar cell anode and a solar cell cathode coupled to the photovoltaic material (e.g., as shown in FIG. 5, which is further discussed below). The solar cell may generate a voltage between the solar cell anode and solar cell cathode when the photovoltaic material is exposed to light (e.g., sunlight). The solar cell of the solar shell (e.g., the solar cell anode and/or solar cell cathode) may be conductively coupled to the control circuitry of the electronic assembly 114. The energy harvested by the solar cell may be used to charge the battery 120. In some embodiments, the battery 120 of the MSB 100 may be configured to be charged by another charging source, such as grid charging, in addition to by the solar cell of the solar shell 102. For example, the MSB anode 112 and MSB cathode 130 may be coupled to a grid charger and/or the MSB 100 may include a power port (e.g., a USB port or another suitable direct current power port) to receive an external charging signal.

As discussed above, the electronic assembly 114 may be conductively coupled to the solar shell 102 (e.g., the solar cell anode and/or solar cell cathode). In some embodiments, the electronic assembly 114 may further be coupled to the rechargeable battery 120 (e.g., the battery anode and/or the battery cathode), and/or the anode 112, and/or the cathode 130 of the MSB 100. The electronic assembly 114 may conductive couple the battery anode to the MSB anode 112 and/or the battery cathode to the MSB cathode 132. Alternatively, the anode 112 and/or cathode 130 of the MSB 100 may be coupled to the battery anode and battery cathode, respectively, without being passed through the control circuitry 114.

In some embodiments, the battery cathode of the battery 120 and/or the electronic assembly 114 may be coupled to the cathode 130 of the MSB 100 by the alignment strip 116. In other embodiments, the battery cathode and/or the electronic assembly 114 may be coupled to the cathode 130 of the MSB 100 by a conductor that is separate from the alignment strip 116.

In various embodiments, the electronic assembly 114 may perform one or more functions, such as ensuring that the solar cell of the solar shell 102 is operating at its maximum operating point, regulating the output voltage and/or current of the battery 120 that is provided to the anode 112 and/or cathode 130 of the MSB 100, determining a health of the battery 120 and/or solar shell 102, determining a charge level of the battery 120, displaying information about the MSB 100 on a display of the MSB 100, and/or transmitting information about the MSB 100 to an external device. In some embodiments, the electronic assembly 114 may monitor the voltage and/or current at the solar cell anode, the MSB anode 112, and/or the battery anode. For example, the electronic assembly 114 may monitor the voltage and/or current at the solar cell anode to operate the solar cell at the maximum operating point (e.g., maximum power point, given by multiplying voltage and current). The electronic assembly 114 may use any suitable algorithm for determining/implementing the maximum power point, such as incremental conductance. Additionally, or alternatively, the electronic assembly 114 (e.g., control circuitry) may monitor the charging of the battery 120 (e.g., from the solar cell of the solar shell 102 and/or from grid charging), may regulate the charging, for example, if the charging source provides too much current and/or voltage, or the battery is full.

In some embodiments, the anode 112, cathode 124, and/or conductive alignment strip 116 may be any suitable conductor, such as copper (e.g., oxygen free (OF) copper or tough pitch (TP) copper), etc. OF copper is 99.99% pure, readily available, and a superior conductor to ordinary copper. Tough pitch (TP) copper is ordinary copper and is 99% pure. It conducts by definition 100% and is almost 7% more resistive than OF copper. OF copper is also highly resistive to corrosion. In some embodiments, all or most metal parts of the MSB 100 may be formed of the same metal to prevent galvanic corrosion.

Figure 2:
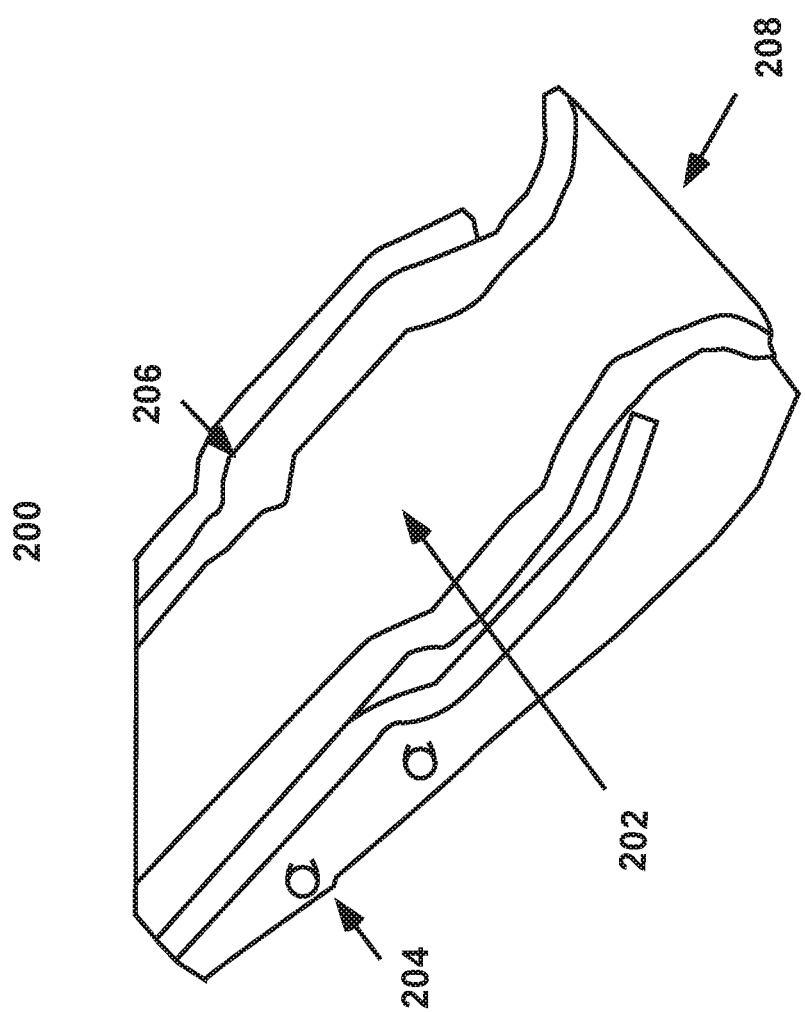
FIG. 2 illustrates a sheared cross-section of inserted, snap-in male and female pins that may be used as a connection mechanism to conductively couple components of an MSB, in accordance with various embodiments.

FIG. 2 illustrates a connection mechanism 200 that may be used to conductively couple the rechargeable battery and the control circuitry of the MSB (e.g., the rechargeable battery 120 and the control circuitry 114 of MSB 100), in accordance with various embodiments. It will be apparent that the mechanism 200 is provided as one example connection mechanism, and that other connection mechanisms are contemplated.

The mechanism 200 may include a male pin 202, inserted into a female pin clamp 204. In some embodiments, the male pin 202 may be the contact of the control circuitry and the female pin clamp 204 may be a contact of the battery. The male pin, 202 has an enlarged flange 206 that pushes apart the female clamp, which closes at the end of the enlarged flange of the male pin. The closure of the female pin clamp, 204 makes secure electrical contact and physical connectedness between the battery and the electronics. The shaft 208 of the male pin is shown, which leads to the control circuitry.

FIG. 3A illustrates a top down view of components of an electronics assembly 300, in accordance with various embodiments. The electronics assembly 300 may correspond to the electronics assembly 114 of MSB 100.

Electronics assembly may include control circuitry 301 including a processor 304 coupled to a printed circuit board (PCB) 302. The processor 304 may include any suitable processor, such as a Microchip™ PIC16(L)F1705, which is a sixteen lead, quad flat no-leads package, with a low profile and small size (4.0×4.0 mm and 0.9 mm thick).

In some embodiments, the control circuitry 301 of electronics assembly 300 may further include a communication circuit 306 coupled to the processor 304. The communication circuit 306 may be a separate integrated circuit (IC) chip from the processor 304 or may be integrated onto the same IC chip with the processor 304. The communication circuit 306 may enable the processor 304 to communicate (e.g., transmit and/or receive information) with one or more external devices. The communication circuit 306 may communicate using any suitable wireless communication protocol, such as radio frequency identity (RFID), Bluetooth, Bluetooth Low Energy, a wireless local area network (WLAN, such as Wi-Fi), a cellular network (e.g., a network standardized by the Third Generation Partnership Project (3GPP), such as Long Term Evolution (LTE) and/or machine-type communications (MTC)), machine-to-machine communications, or another suitable communication protocol. In some embodiments, the communication circuit 306 may communicate using a wired interface (e.g., Universal Serial Bus (USB)) in addition to or instead of a wireless interface.

In various embodiments, the electronics assembly 300 may further include a charging circuit 308 that is coupled to the rechargeable battery of the MSB to recharge the battery (e.g., using the energy harvested by the solar cell). The electronics assembly 300 may further include a precision transformer to keep the solar cell on the maximum power point.

The electronics assembly 300 may further include an antenna 320 coupled to the communication circuit 306. Antenna 320 is shown in FIG. 3 as an RFID wafer. However, it will be apparent that other types of antennas 320 may be used.

In various embodiments, the communication circuit 306 may generate energy, used to extract information from the RFID, even if the processor 304 is in a low power state or has no power at all.

FIG. 3B illustrates a perspective view of a control circuitry 332 coupled to the anode 334 of the MSB. The control circuitry 332 may correspond to the control circuitry 301 of FIG. 3A. The anode 334 may be electrically coupled to the control circuitry 332.

FIG. 3C illustrates an assembled electronics assembly 300 in accordance with various embodiments. The electronics assembly may include the control circuitry 332 coupled to the anode 334. The control circuitry 332 may be coupled to the antenna 330 by a conductor 344. In some embodiments, the control circuitry 332 and/or antenna 330 may be potted by potting material 340. The anode 334 may extend from the control circuitry 332 and may not be covered by the potting material 340. Additionally, contacts 342 of the control circuitry 332 may electrically couple the control circuitry 332 to the rechargeable battery.

In various embodiments, the control circuitry 332 may also be electrically coupled to the solar cell of the solar shell and/or to the cathode of the MSB, as discussed above.

Figures 4A, 4B:
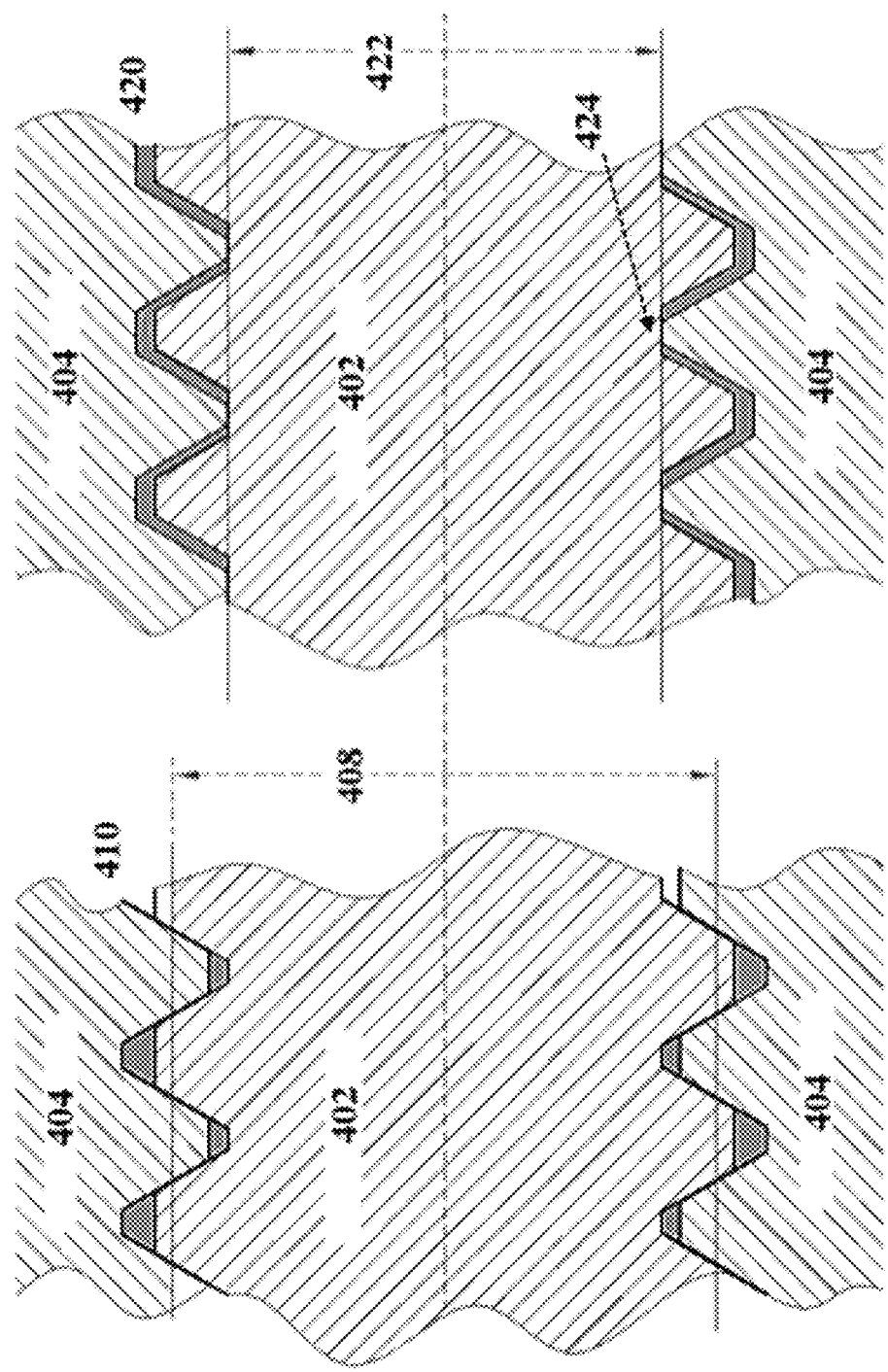
FIG. 4A illustrates a mating mechanism to couple the battery cap to the solar shell of the MSB in accordance with various embodiments.
FIG. 4B illustrates another mating mechanism to couple the battery cap to the solar shell of the MSB in accordance with various embodiments.

FIGS. 4A and 4B illustrate screw-in mating mechanisms 410 and 420, respectively, that may be used to mate the battery cap to the solar shell of the MSB, in accordance with various embodiments. Those MSBs that have a screw in, cathode end cap will utilize equal pitch threads with matching minor diameters.

The mating mechanism 410 has external screw threads 402 and internal screw threads 404 that have matching pitch diameters 408, but do not have matching minor diameters. The minor diameter may be defined as the inner diameter of the screw threads 402. The outer diameter of the screw threads 402 may be referred to as the major diameter. The pitch diameter may refer to the diameter of an imaginary co-axial cylinder that intersects the midpoint of the screw threads 402 (e.g., between the inner edge and outer edge of the screw threads 402). As can be seen in FIG. 4A, no part of the internal threads 404 meet the external shaft. Accordingly, the mating mechanism 410 may provide a poor moisture barrier. However, the mating mechanism 410 will provide a passive pressure valve for equalization of excessive pressure with the environment.

In contrast, the external screw threads 402 and internal screw threads 404 of the mating mechanism 420 have matching pitch diameters and matching minor diameters 422. As can be seen, there is physical thread contact with the shaft, all the way up the screw, forming a water resistant seal. Accordingly, the internal screw threads 404 are closer to the exterior screw shaft than is provided by the mating mechanism 410. This produces a water-resistant fitting that may be at least ten times more effective as a moisture barrier than the mating mechanism 410. In some embodiments, an MSB with such a watertight seal may include a barometric pressure sensor (e.g., coupled to the control circuitry) to detect the pressure inside the MSB, and alert the user (e.g., on the display of the MSB or on an associated external device) to equalize the pressure manually by opening the battery cap.

In some embodiments, the solar cell of the solar shell (e.g., solar shell 102) may be meta-encapsulated, including a first encapsulation layer on the solar cell that at least partially encapsulates the solar cell and a second encapsulation layer on the first encapsulation layer that at least partially encapsulates the solar cell. For example, FIG. 5 shows a cross-sectional view of a solar shell 500 with a fully meta-encapsulated solar cell 502, in accordance with various embodiments. The solar shell 500 may correspond to the solar shell 102 of FIG. 1. The solar cell 500 includes a solar cell 502, a first encapsulant layer 504, and a second encapsulant layer 506. The first encapsulant layer 504 is disposed on the perovskite cell 502 and fully encapsulates the perovskite cell 502. The second encapsulant layer 506 is disposed on the first encapsulant layer 504 and fully encapsulates the perovskite cell 502 and the first encapsulant layer.

The meta-encapsulation of the solar cell 502 may protect the solar cell 502 from moisture and/or physical deformation, thereby providing the solar shell 500 with a long usable lifetime.

In some embodiments, an adhesive 508 (e.g., a transparent adhesive) may be disposed between the first encapsulant layer 504 and the second encapsulant layer 506. Additionally, or alternatively, some embodiments of the device 500 may include a surfactant 510 on the outer surface of the second encapsulant layer 506. The surfactant 510 may prevent scratches or other deformations in the second encapsulant layer 506. Other embodiments may not include the surfactant 510.

In various embodiments, the solar cell 502 may include a photovoltaic material (e.g., perovskite) 512, an anode 514, and a cathode 516. The anode 514 and cathode 516 may be on opposite sides of the photovoltaic material 512, as shown in FIG. 5, although other configurations are possible. For example, in some embodiments, the cathode 516 may face the outer surface 518 of the solar shell 500, and the anode 514 may face the interior surface 520 of the solar shell 500 (e.g., that defines the open interior region of the solar shell 500).

The solar shell 500 may further include an anode contact 522 and a cathode contact 524 that are coupled to the anode 514 and cathode 516, respectively, of the solar cell 502. The anode contact 522 and cathode contact 524 may conductively couple the anode 514 and cathode 516 of the solar cell 502 to corresponding contacts of the electronics assembly of the MSB (e.g., electronics assembly 114). In some embodiments, the anode contact 522 and/or cathode contact 524 may be coupled to the respective anode 514 and cathode 516 by a respective anode wire 526 and cathode wire 528. The anode contact 522 and/or cathode contact 524 may be any suitable type of contact, such as a male pin contact as shown in FIG. 5, a female pin contact, etc. In some embodiments, the anode contact 522 and/or cathode contact 524 may be removably coupled to the corresponding contacts of the electronics assembly. In other embodiments, the anode contact 522 and/or cathode contact 524 may be permanently coupled to the corresponding contacts of the electronics assembly.

The anode 514 and/or cathode 516 may include any suitable materials. For example, in some embodiments, the anode 514 may include graphite, doped carbon fiber, copper, silver, stanene, praseodymium cerium copper oxide (PCCO) on graphene, and/or another suitable material (e.g., another superconducting material structure as described herein). Additionally, or alternatively, the cathode 516 may include a transparent ceramic conductor, such as indium tin oxide (ITO), fluorine doped tin oxide (FTO), and/or another transparent conducting material. The anode wire 526 and cathode wire 528 may include a conductor inside a protective sheath. In some embodiments, the anode wire 526 and/or cathode wire 528 may extend from the solar cell 502 through the first encapsulant layer 504, and at least partially through the second encapsulant layer 506, as shown.

The first encapsulant layer 504 and/or second encapsulant layer 506 may include any suitable material or materials with the desired properties. For example, in some embodiments, the first encapsulant layer 504 may include polychlorotrifluoroethylene (PCTFE), a fluoropolymer resin, polyethylene terephthalate (PET), polysiloxanes (e.g., silicone), and/or ethyl vinyl acetate (EVA). Additionally, or alternatively, the second encapsulant layer 506 may include polycarbonate and/or glass. If the second encapsulant layer includes glass, the glass may be a low iron glass (e.g., having an iron oxide content of less than 0.02%). Glass containing less iron oxide has a higher solar transmissivity than traditional soda lime glass (e.g., about 91% compared with about 85%), thereby providing greater efficiency for the solar cell.

Both the first encapsulant layer 504 and the second encapsulant layer 506 may be transparent to enable sunlight to pass through to the solar cell 502. In one embodiment, the first encapsulant layer 504 and the second encapsulant layer 506 may have a solar transmissivity of 80% or greater, such as a solar transmissivity of 90% or greater. In some embodiments, the first encapsulant layer 504 may have a lower permeability to moisture than the second encapsulant layer 506. Additionally, or alternatively, the second encapsulant layer 506 may be stronger (e.g., in tensile strength and/or flexural strength) than the first encapsulant layer 504. For example, in some embodiments, the first encapsulant layer 504 may have a moisture vapor transmission rate of less than 0.1 grams per square meter per day ($g/m^2/day$). Additionally, or alternatively, the second encapsulant layer 506 may have a tensile strength of greater than 2,000 pounds per square inch, such as a tensile strength greater than 5,000 pounds per square inch. Together, the first and second encapsulant layers create an environment for the solar cell 502 that is highly waterproof, while also being strong and durable.

The solar shell 500 may be formed by any suitable process. For example, in some embodiments, the first encapsulant layer 504 and/or second encapsulant layer 506 may be applied to the solar cell 502 in liquid form and heat compressed to harden around the solar cell 502. In some embodiments, a closed tube of the material of the first encapsulant layer 504 may be heat compressed to tightly fit to the solar cell 502. A second closed tube of the material of the second encapsulant layer 506 may be heat affixed to the first encapsulant layer 504, using transparent adhesive 508 for adhesion. In embodiments that include the surfactant 510, the surfactant may be applied, for example, by dip coating or another suitable method. The manufacturing method may prevent pinholes from forming in the first encapsulant layer 504 and/or second encapsulant layer 506, which may otherwise be a source of moisture intrusion.

In some embodiments, the second encapsulant layer 506 may be formed around the solar cell 502 using microelectromechanical systems (MEMS) techniques and/or nanotechnology to join two or more portions of the second encapsulant layer 506. For example, surfaces of the material of second encapsulant layer 506 that are to be joined may be prepared for bonding by etching or another suitable process and then joined together to form a strong and watertight bond.

While the solar shell 500 is shown in FIG. 5 with both first encapsulant layer 504 and second encapsulant layer 506 fully encapsulating the solar cell 502, in other embodiments, one or both of the first encapsulant layer 504 and second encapsulant layer 506 may only partially encapsulate the solar cell 502 (e.g., leaving a portion of the underlying layer exposed). It will be understood that in some embodiments one or more electrical wires (e.g., the anode wire 526 and/or cathode wire 528) may extend through the first encapsulation layer 504 or second encapsulation layer 506. The penetration of the electrical wires (e.g., the conductive wire and surrounding insulation) does not negate the full encapsulation.

In various embodiments, the conductance of materials in the MSB is important because with improved conductance, more current flows for the same voltage. A higher conductance means a lower resistance. A lower resistance means more power is delivered and less heat created. Superconductors are materials that conduct electricity with no resistance. Unlike the more familiar conductors such as silver, copper, or steel; a superconductor can carry a current indefinitely without losing any energy.

The units of measure for resistivity are Ohms-meter (Ω-m), which corresponds to the resistivity of a substance of which a meter cube has a resistance of 1 ohm. An ohm is the unit of electrical resistance, expressing the resistance in a circuit transmitting a current of one ampere when subjected to a potential difference of one volt.

Table 1 illustrates different materials that may serve as a conductor for the MSB solar cell. The discovery of stanene is unparalleled in the field of condensed matter physics. Two-dimensional (2D) (referring to a layer with a thickness of one atom or molecule) graphene has prompted the idea of the development of other 2D materials from their bulk three-dimensional (3D) allotropes. In 2017, various types of 2D materials have been discovered; phosphorene, silicene, germanene, 2D boron nitride, and transition-metal dichalcogenides, with others sure to follow. Metal dichalcogenides have the formula $ME_2$, where M is a transition metal and E is sulphur, selenium, or tellurium. The chalcogens are the chemical elements that makeup group 16 of the periodic table. This group is also known as the oxygen family. It consists of the elements oxygen, sulphur, selenium, tellurium, and polonium. These materials are only illustrative, and it will be apparent that other conductors may be used.

TABLE 1

| Material | Resistivity (Ω-m) | Description |
|---|---|---|
| Stanene | 0 | Atomic layer of tin (Sn) on graphene or other suitable material |
| superconducting germanene | 0 | Atomic layer of hexagonal germanium (Ge) on molybdenum disulfide, or other suitable material |
| superconducting PCCO (PrCeCuO) | 0 | Molecular layer of praseodymium cerium copper oxide (PCCO) on graphene or other suitable material |
| superconducting PCCO family ($Pr_{2-x}Ce_xCuO_4$) | 0 | $Pr_{2-x}Ce_xCuO_4$ on graphene or other suitable material |
| superconducting silicene | 0 | Atomic layer of hexagonal silicon on silver or other suitable material |
| superconducting phosphene | 0 | Atomic layer of hexagonal phosphorus on silver or other suitable material |
| superconducting borophene | 0 | Atomic layer of hexagonal boron on silver or other suitable material |
| 99.999% pure Silver | $1.38 \times 10^{-8}$ | 99.999% pure |
| 99.990% pure Silver | $1.49 \times 10^{-8}$ | 99.990% pure; ultra fine |
| 99.999% pure Copper | $1.56 \times 10^{-8}$ | 99.999% pure |
| 99.990% pure Copper | $1.61 \times 10^{-8}$ | 99.990% pure; oxygen free (OF) copper |

The materials provided in Table 1 include silver and copper (in both 99.999% pure and 99.990% pure variants). Table 1 further includes superconducting stanene, superconducting germanene on molybdenum disulfide, superconducting praseodymium cerium copper oxide (PCCO) or $Pr_{2-x}Ce_xCuO_4$ on graphene, superconducting phosphene on silver, and superconducting borophene on silver, all of which may be superconductors at room temperature (e.g., resistivity of 0). Stanene may be a layer of tin (Sn) that is substantially one atom thick (e.g., an atomic monolayer) on graphene or another suitable base layer. Germanene is an atomic hexagonal layer of germanium that is substantially one atom thick and may be on molybdenum disulfide, or another suitable base layer. Silicene is an atomic hexagonal layer of silicon that forms a superconductor when paired with silver. PCCO and $Pr_{2-x}Ce_xCuO_4$ may also be used as an atomic monolayer on graphene or another suitable base layer. Phosphene is an atomic hexagonal layer of phosphorus and may be on silver or another suitable base layer. Borophene is an atomic hexagonal layer of boron and may be on silver or another suitable base layer.

One or more of the materials listed in Table 1 may be used for any conductive part of the MSB, such as the MSB anode, the MSB cathode, the solar cell anode, the battery anode, the battery cathode, and/or one or more contacts and/or conductive paths that electrically couple components of the MSB. In some embodiments, the same conductor may be used for all or most conductive parts of the MSB (e.g., to prevent galvanic corrosion). As the solar cell cathode may be required to be transparent, e.g., with a transmissivity close to or greater than low-iron glass, the solar cell cathode may include a different material in some embodiments.

As an example, the material stanene may be suitable as an anode, as it is a superconductor with no resistance, and therefore no heat. Technically, stanene is a topological insulator, meaning it is an insulator on the inside, and a conductor on the outside. A one-atom-thick layer of tin (Sn) on the surface, conducts electricity with 100% efficiency, or zero resistance. The structure of the stanene allows electrons to move along the outside surface of tin without resistance at room temperature and is stable to 100° C.

Figure 6:
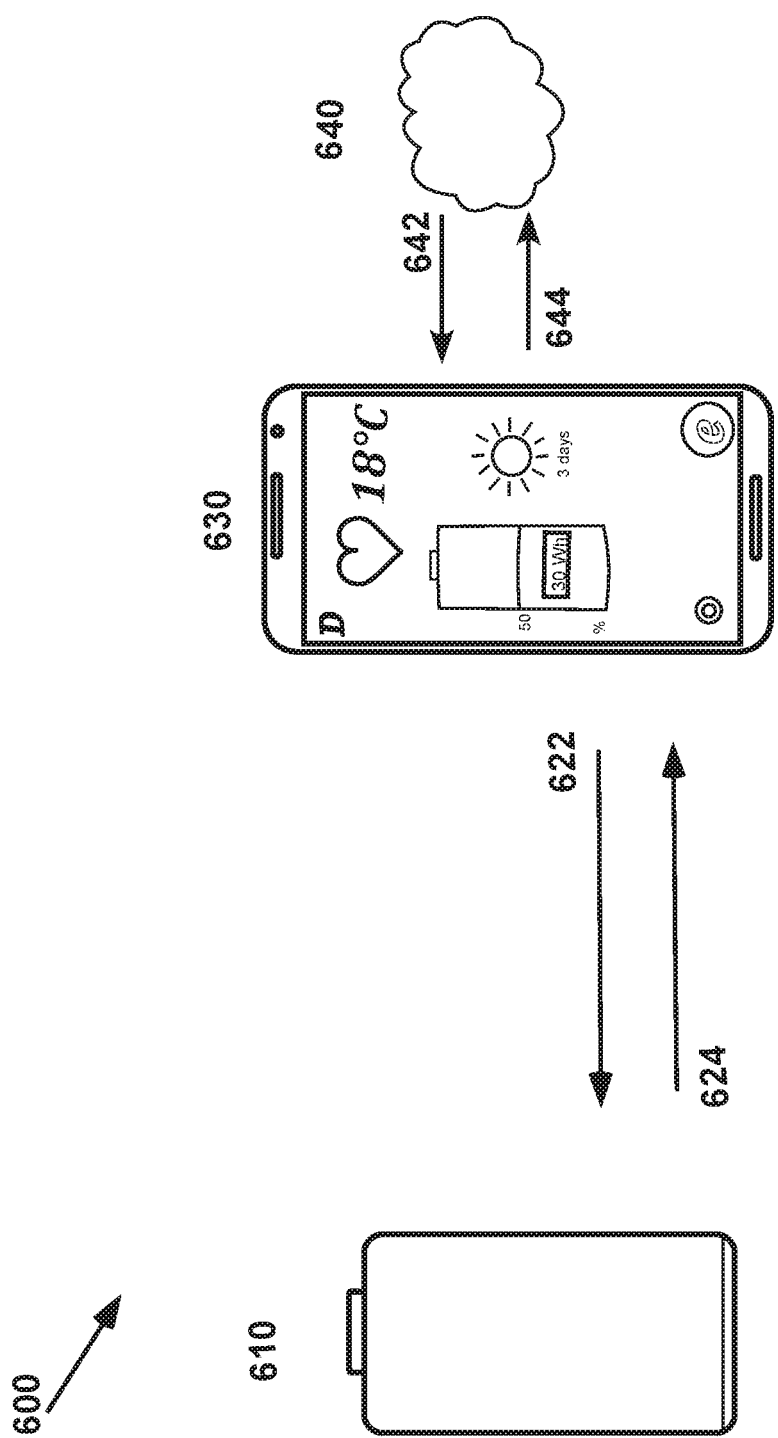
FIG. 6 is a flow diagram 600 to illustrate exchange of information associated with an MSB, in accordance with various embodiments.

FIG. 6 is a flow diagram 600 to illustrate exchange of information associated with an MSB, in accordance with various embodiments. Flow diagram 600 illustrates an MSB 610, an external device 630, and an Internet cloud 640. The MSB 610 may be configured to communicate with the external device 630 (e.g., receive messages from the external device 630 via downlink interface 622 and/or send messages to the external device 630 via uplink interface 624). The external device 630 may be any suitable device, such as a smartphone, a computer, a smart watch or other smart device, and/or a dedicated device for communicating with MSBs. As discussed above, the MSB 610 and external device 630 may communicate using any suitable protocol, such as RFID, Bluetooth, Bluetooth Low Energy, a wireless local area network (WLAN, such as Wi-Fi), a cellular network (e.g., a network standardized by the Third Generation Partnership Project (3GPP), such as Long Term Evolution (LTE) and/or machine-type communications (MTC)), machine-to-machine communications, or another suitable communication protocol. The MSB 610 may be an Internet-of-Things (IoT) device.

The MSB 610 may receive any suitable information from the external device 630 (e.g., downlink interface 622), such as a status inquiry or request for other information, an operational command, a software or firmware update, etc. Additionally, the MSB 610 may transmit any suitable information to the external device 630 (e.g., via uplink interface 624), such as battery status (e.g., charge level, health information, operational information, etc.), solar shell status (e.g., health information, efficiency information, etc.), operational information (e.g., amount or rate of solar energy harvested and/or other statistics).

In some embodiments, the external device 630 may include a display 635 to display information associated with the MSB 610, such as battery level, health information, operational information, etc. Additionally, or alternatively, the MSB 610 may include a display (not shown) to display information associated with the MSB 610. In some embodiments, the display on the MSB 610 may include an electronic paper display or other low-power display. Electronic paper displays only consume power to change the display. The MSB 610 may additionally or alternatively include one or more indicator lights (e.g., light emitting diodes (LEDs), not shown) to convey information, such as the charge level of the battery. In some embodiments, the MSB 610 may include a physical interface, such as one or more buttons or touch sensors, with may turn on the display or indicator lights, facilitate pairing with the external device 630 and/or perform one or more other functions.

In various embodiments, the external device 630 may communicate with the internet cloud 640 to exchange information associated with the MSB 610 (e.g., via downlink interface 642 and/or uplink interface 644). For example, the external device 630 may send battery level information, health information, operational information, information associated with solar renewable energy credit transactions, and/or other suitable information to the internet cloud 640. The internet cloud 640 may correspond to a remote and/or distributed server, remote and/or distributed computing device, and/or other suitable system. The internet cloud 640 may store information associated with the MSB 610 and/or other MSBs, and may calculate or compile statistics from the stored information, such as usage statistics, health metrics, etc.

In some embodiments, the internet cloud 640 may transmit information to the external device 630 via downlink interface 642. The information may include statistics associated with the MSB 610 and/or a group of MSBs, software or firmware updates for the MSB 610, marketing information to be displayed to the customer on the display 635, information associated with solar renewable energy credit transactions, etc.

While flow diagram 600 illustrates example communication interfaces for the MSB 610 to communicate with one or more external devices 630 and/or the internet cloud 640, it will be apparent that other configurations may be used. Additionally, some embodiments of the MSB 610 may not be configured to wireless communicate with external devices (e.g., may not be IoT enabled). The inclusion of IoT enablement may be determined based on cost considerations, product differentiation, and/or size of the MSB (e.g., larger MSBs may be IoT enabled while smaller MSBs may not be IoT enabled).

FIG. 7 illustrates a family of MSBs 700 that are in the form of different types of commercial batteries, in accordance with various embodiments. For example, FIG. 7 illustrates a 6-volt (e.g., lantern battery) MSB 710, a Type D MSB 712, a Type C MSB 714, a 9-volt MSB 716, a AA MSB 720, a AAA MSB 722, a AAAA MSB 724, and an LR44 (e.g., button) MSB 726. It will be apparent that the MSB as described herein may be provided in any suitable form factor such as another type of commercial battery and/or a battery with a unique design (e.g., for a specific product, such as a battery-powered electronic device).

The MSBs 700 may include the same, similar, or different components/features, depending on, for example, size and/or other considerations. For example, the MSBs 700 may be IoT enabled or not, and may or may not include an on-board display (e.g., as shown for MSB 710 and MSB 716). Additionally, in some embodiments, some of the MSBs 700 may include different types of control circuitry than other MSBs 700. For example, the larger MSBs 700 may include a processor to keep the solar cell on the maximum power point, while the smaller MSBs 700 may include a hardware solution (e.g., a dedicated circuit to manage the power point).

FIGS. 8A, 8B, 8C, 8D, and 8E illustrate material compositions that may be used in an MSB, according to various embodiments. For example, one or more of the material compositions depicted in FIGS. 8A-8E may be used for the MSB anode, the solar cell anode, the battery anode, and/or another suitable component of the MSB.

FIG. 8A illustrates a material composition 802 that includes a base material 810, with a layer 812 on the surface of the base material 810. For example, the base material 810 may have a cylindrical shape and the layer 812 may be disposed on the circumferential outer surface of the base material 810. Other configurations are possible.

In various embodiments, the base material 810 may be graphene, molybdenum disulfide, silver, and/or another suitable material. In some embodiments, the layer 812 may be an atomic monolayer of tin, germanene, silicene, PCCO, $Pr_{2-x}Ce_xCuO_4$, phosphene, or borophene. Specific pairings of these layers 812 and a corresponding base material 810 are discussed elsewhere herein. For example, tin may be paired with graphene, germanene may be paired with molybdenum disulfide, PCCO or $Pr_{2-x}Ce_xCuO_4$ may be paired with graphene, and silicene, phosphene, and borophene may be paired with silver. It will be apparent that other materials and/or combinations for the base material 810 and layer 812 may be possible.

The material composition 802 may be superconducting to a relatively high temperature, such as approximately 100° C. Graphene is a flexible crystalline allotrope of carbon, such as, for example, a diamond in which the carbon atoms are bonded together in a tetrahedral lattice, graphite in which the carbon atoms are bonded together in hexagonal lattices, and/or graphene which are single two dimensional sheets (monoatomic) of graphite. A structure with multiple two-dimensional sheets, may be called fullerene, in which the hexagonally connected carbon atoms bond together in spherical, tubular, or ellipsoidal formations. Accordingly, the base material 810 may be referred to as being of fullerene. The outer layer of fullerene is a one atom thick sheet of graphene with a hexagonal shaped atomic interconnection.

Alternatively, as discussed above, the layer 812 may include praseodymium cerium copper oxide (PrCeCuO and/or $Pr_{2-x}Ce_xCuO_4$ (commonly referred to as PCCO)), e.g., in a 1 molecule thick monolayer on the graphene base material 810. PCCO becomes a room temperature superconductor when applied to graphene. The monolayer of Sn remains superconducting until 100° C., when the graphene disassociates; whereas PCCO is stable until a much higher temperature.

FIGS. 8B and 8C show a perspective view and a top-down view, respectively, of a material structure 804, in accordance with various embodiments. Material structure 804 includes a base material 816 that is hollow (e.g., a hollow cylinder), with a hole 814 through the base material 816.

The material structure 804 may further include a layer 818 on the outer surface of the base material 816. The base material 816 and/or layer 818 may include any suitable materials, such as the materials described above for the base material 810 and layer 812, respectively.

In various embodiments, the hollow cylinder shape of the material structure 804 may be beneficial for the MSB as described herein. For example, the photovoltaic material may be disposed on the layer 818, and a cathode may be formed on the photovoltaic material to form the solar cell. In some embodiments, the solar cell may be meta-encapsulated as described herein. The electronics assembly and rechargeable battery may be disposed in the open interior region defined by the hole 814.

FIG. 8D illustrates another material structure 820, in accordance with various embodiments. The material structure 820 may include a layer 822 on a flat sheet 824 of base material (e.g., graphene). The sheet 824 may be substantially two-dimensional (e.g., with a length and width substantially longer than its height). The sheet 824 and/or layer 822 may include any suitable materials, such as the materials described above for the base material 810 and layer 812, respectively.

FIG. 8E illustrates another material structure 830, in accordance with various embodiments. The material structure 830 may include a layer 826 of a base material 824. The material structure 830 may be similar to the material structure 820, except curved into a curved planar shape, rather than a flat planar shape. Accordingly, the material structure 830 may be formed into the shape desired for the solar shell of the MSB, such as a hollow cylinder, a hollow rectangular shape, etc.

For example, FIG. 8F illustrates a material structure 840 in a hollow cylindrical shape, in accordance with various embodiments. The material structure 840 may be similar to the material structure 830. A conductive anode contact 860 may be coupled to the material structure 840 to provide an electrical connection between the anode and the control circuitry of the MSB. The anode contact may include a conductive material, such as copper, silver, etc. A conductive adhesive and/or solder may be used to couple the anode contact 860 to the material structure 840.

In various embodiments, the MSB anode may be formed into a suitable shape, such as a hollow cylinder, hollow rectangular shape, etc. A suitable photovoltaic material may subsequently be deposited on the MSB anode, and the MSB cathode may be formed on the photovoltaic material to form the solar cell of the solar shell, as described herein. The photovoltaic material may include, for example, amorphous silicon, various thin-films, and perovskite. Some thin-film examples are copper indium gallium selenide (CIGS) or cadmium telluride.

For example, in one non-limiting embodiment, the solar shell of the MSB may include a multiple layer tandem perovskite solar cell with a topological insulator of graphene, having a monolayer of tin atoms or a monolayer of PCCO family molecules. The anode may have a shape that corresponds to the material structure 804, material structure 820, or material structure 830, in accordance with various embodiments.

FIG. 9A illustrates a rechargeable battery 900 that may be used in the MSB, in accordance with various embodiments. The battery 900 is shown partially disassembled in FIG. 9A to show interior structure. FIGS. 9B and 9C show additional views of disassembled components of the battery 900.

The battery 900 includes an anode 901. The battery 900 further includes a cathode 904, and an electrolytic layer 902 between the anode 901 and the cathode 904. The anode 901, electrolytic layer 902 and cathode 904 may be pressed together (e.g., by a press 906, as shown in FIG. 9C), and then formed into the shape of the battery, (e.g., rolled into a cylinder, as shown in FIG. 9A). In some embodiments, the battery 900 may include multiple stacks of the anode 901, electrolytic layer 902, and cathode 904 coupled together, as shown. The individual stacks of anode 901, electrolytic layer 902, and cathode 904 may be referred to as a sub-battery. In some embodiments, the anode 901 of one sub-battery may be coupled to the cathode 904 of the adjacent sub-battery, in which case the voltages of the sub-batteries are additive to generate the overall voltage of the battery 900. In other embodiments, the anodes 901 of adjacent sub-batteries may be coupled together and/or the cathodes 901 of adjacent sub-batteries may be coupled together, in which case the currents of the sub-batteries are additive. A mixture of both anode-cathode coupling and anode-anode/cathode-cathode may also be used.

The anode 901 and/or cathode 904 may be any suitable material structure as described herein, such as a material structure including a first layer coupled with a second layer, as described with respect to Table 1, FIGS. 8A-8F, and elsewhere herein. In some embodiments, the anode 901 and/or cathode 904 may include an atomic or molecular monolayer and/or a layer having a hexagonal atomic structure, as described herein. The electrolytic layer 902 may include any suitable material, such as lithium (e.g., lithium carbonate), a lithium-ion electrolyte with polymeric membranes, a solid composite electrolyte such as plastic polymer, and/or another suitable material. Accordingly, in some embodiments, the battery 900 may be a lithium-ion battery.

The battery 900 may further include anode connection tabs 920 coupled to the respective anodes 901 and cathode connection tabs 922 coupled to respective cathodes 904. The connection tabs 920 and 922 may couple the respective anodes 901 and cathodes 904 to respective contacts 960 of the battery 900. The contacts 960 may be conductively coupled to the electronics assembly of the MSB, as discussed herein. For example, the contacts 960 may be female electrical pressure pin connectors (as shown in FIG. 9A), male electrical pressure pin connectors, or another suitable type of electrical connector.

The battery 900 may further include a case 942 that surrounds the sub-batteries and forms the outside surface of the battery 900. The case 942 may include any suitable material, such as rigid polyethylene terephthalate (PET) plastic.

In some embodiments, the battery 900 may further include a pressure relief valve 940. As lithium batteries are charged, they swell. If the battery is heated, it will swell. These factors create increased air pressure inside the battery, and a relief valve is employed to prevent excessive pressure from building, which may otherwise destroy the battery's physical integrity. If a lithium battery were to suffer a physical break due to pressure, it is possible the battery may catch fire.

Figure 10:
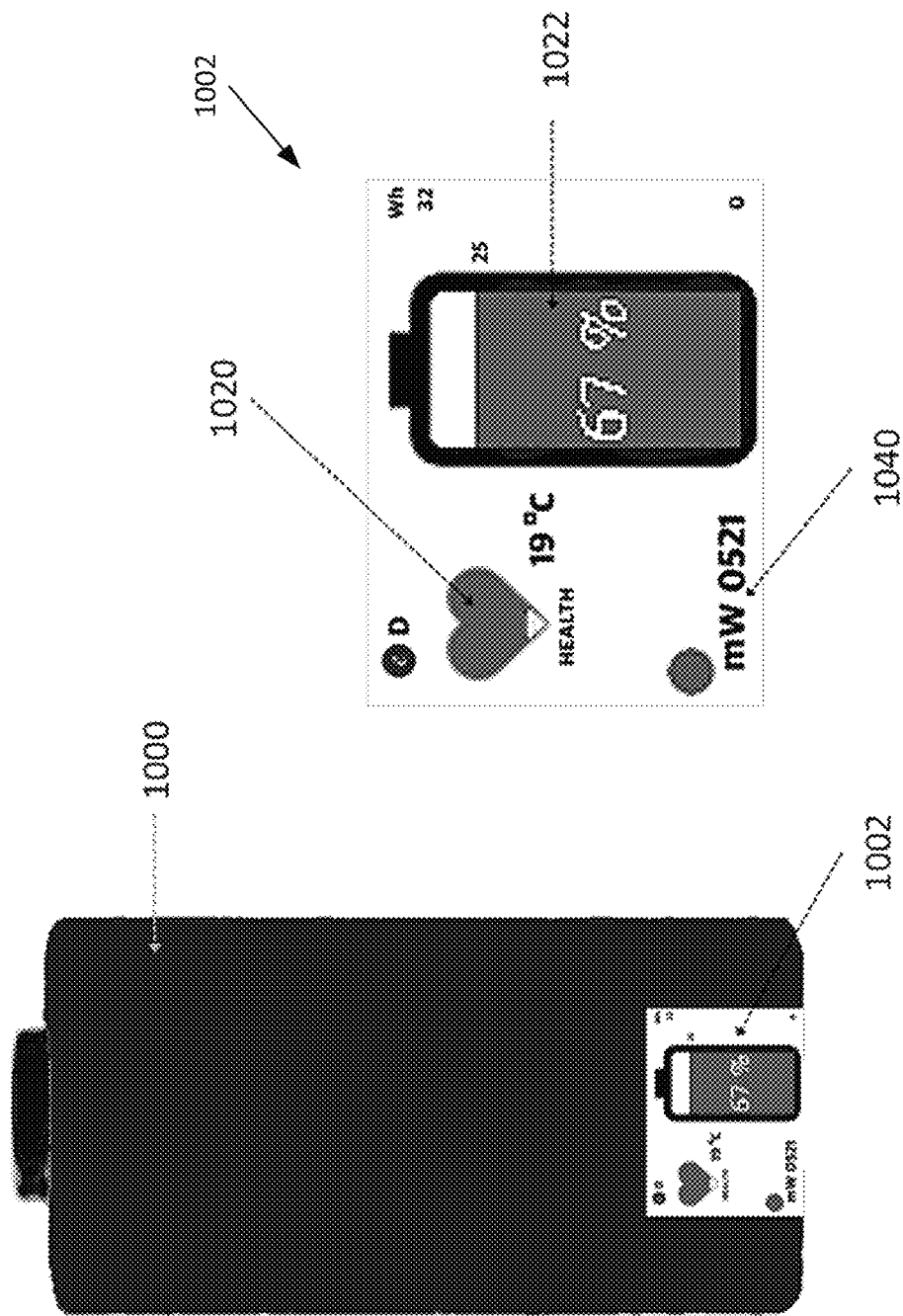
FIG. 10 illustrates a display of an MSB, in accordance with various embodiments.

FIG. 10 illustrates an MSB 1000 including a display 1002 that may display information associated with the MSB 1000, in accordance with various embodiments. The MSB 1000 may correspond to any of the MSBs described herein. In some embodiments, the display 1002 may be included in or coupled to the solar shell. In some embodiments, the display 1002 may be encapsulated by one or more encapsulant layers (e.g., encapsulant layers 504 and/or 506 of FIG. 5). The display 1002 may use any suitable display technology, such as electronic paper or another low-power display technology.

The display 1002 shown in FIG. 10 is merely an example, and other embodiments may use a different type, location, and/or size of display. For example, in some embodiments, the MSB may include a display in a ring around the bottom of the solar shell (e.g., adjacent the opening for the battery cap), which may be an efficient use of space to enable the rest of the exterior surface of the solar shell to pass light to the solar cell for energy harvesting. Additionally, in some embodiments, when the MSB communicates with an external device (e.g., external device 630), the external device may additionally or alternatively convey information in a similar manner to that shown and described for display 1002.

The display 1002 may display one or more indicators 1020, 1022, and/or 1040 associated with the MSB. For example, indicator 1020 may indicate a health of the battery, the indicator 1022 may indicate a charge state of the battery of the MSB, and/or the indicator 1040 may indicate a state of solar charging (e.g., whether and/or to what extent the solar cell is charging the battery. The indicators 1020, 122, and/or 1040 may convey information in any suitable manner, such as numerically and/or graphically (e.g. using a partially filled shape with a fill level that corresponds to the associated metric, and/or a shape that changes color or appearance based on the metric).

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A modular solar battery, comprising:
   a solar shell including a solar cell, wherein the solar shell has a three-dimensional shape with an open interior region;
   a rechargeable battery to be disposed in the open interior region, the rechargeable battery to be charged by the solar cell;
   a modular solar battery (MSB) anode and a MSB cathode coupled to the rechargeable battery to provide electrical energy from the rechargeable battery to an electronic device;
   a battery cap coupled to the solar shell, wherein the battery cap is at least partially removable from the solar shell to enable removal of the rechargeable battery from the open interior region; and
   control circuitry in the open interior region and conductively coupled to a solar cell anode of the solar cell and a battery anode of the rechargeable battery, wherein the control circuitry is to control one or more operations of the solar cell or the rechargeable battery.

2. The modular solar battery of claim 1, wherein the one or more operations include maintaining the solar cell on a maximum power point and controlling charging of the rechargeable battery.

3. The modular solar battery of claim 1, wherein the control circuitry includes a communication circuit to transmit information associated with the modular solar battery to an external device.

4. The modular solar battery of claim 1, further comprising an alignment strip to conductively couple the control circuitry with the MSB cathode, wherein the alignment strip is to engage with a notch in the battery to align the battery within the open interior region.

5. The modular solar battery of claim 1, wherein the three-dimensional shape of the solar shell is a cylindrical shape or a rectangular shape.

6. The modular solar battery of claim 1, wherein the modular solar battery implements a commercial battery and the three-dimensional shape of the solar shell corresponds to a shape of the commercial battery.

7. The modular solar battery of claim 6, wherein the commercial battery is a 6-volt battery, a Type D battery, a Type C battery, a 9-volt battery, a AA battery, a AAA battery, a AAAA battery, or an LR44 battery.

8. The modular solar battery of claim 1, wherein the solar cell includes a solar cell anode, a photovoltaic material coupled to the solar cell anode, and a solar cell cathode coupled to the photovoltaic material, wherein the solar cell anode faces the open interior region of the solar cell.

9. The modular solar battery of claim 8, wherein the solar cell anode includes:
   a first layer of graphene; and
   a second layer on the first layer, wherein the second layer includes tin, praseodymium cerium copper oxide (PrCeCuO), or $Pr_{2-x}Ce_xCuO_4$, wherein x is a non-zero value.

10. The modular solar battery of claim 8, wherein the solar cell anode includes:
    a first layer; and
    a second layer coupled with the first layer;
    wherein the first layer includes germanene and the second layer includes molybdenum disulfide, or the first layer includes silicene and the second layer includes silver.

11. The modular solar battery of claim 8, wherein the solar shell includes a first encapsulant layer that surrounds the solar cell and a second encapsulant layer that surrounds the first encapsulant layer and the solar cell, wherein the first encapsulant layer has a permeability to moisture of less than 0.1 grams per square meter per day.

12. The modular solar battery of claim 11, wherein the photovoltaic material includes perovskite.

13. The modular solar battery of claim 1, wherein the battery has a battery anode that includes:
    a first layer; and
    a second layer coupled with the first layer, wherein:
        the first layer includes graphene and the second layer includes tin, praseodymium cerium copper oxide (PrCeCuO), or $Pr_{2-x}Ce_xCuO_4$, wherein x is a non-zero value;
        the first layer includes germanene and the second layer includes molybdenum disulfide; or
        the first layer includes silicene and the second layer includes silver.

14. The modular solar battery of claim 1, wherein the MSB cathode is included in the battery cap.

15. The modular solar battery of claim 1, further comprising a display coupled to the solar shell to display information associated with the modular solar battery.

16. A solar shell for a modular solar battery, the solar shell comprising:
    a solar cell including:
        a solar cell anode;
        a photovoltaic material coupled to the solar cell anode; and
        a solar cell cathode coupled to the photovoltaic material;
    an encapsulant layer that at least partially encapsulates the solar cell and that forms an outside surface of the solar shell, wherein the solar shell has a three-dimensional shape with an open interior region that is to house a rechargeable battery; and
    an anode contact coupled to the solar cell anode to conductively couple the solar cell anode to the rechargeable battery to charge the rechargeable battery, wherein the anode contact is to conductively couple the solar cell anode to the rechargeable battery via an electronics assembly that includes a control circuit to control one or more operations of the solar cell.

17. The solar shell of claim 16, wherein the solar cell has a three-dimensional shape that corresponds to the three-dimensional shape of the solar shell.

18. The solar shell of claim 16, wherein the solar cell anode includes:
a first layer; and
a second layer coupled with the first layer;
wherein:
the first layer includes graphene and the second layer includes tin, praseodymium cerium copper oxide (PrCeCuO), or $Pr_{2-x}Ce_xCuO_4$, wherein x is a non-zero value;
the first layer includes germanene and the second layer includes molybdenum disulfide; or
the first layer includes silicene, phosphorene, or borophene, and the second layer includes silver.

19. The solar shell of claim 16, wherein the encapsulant layer is an outer encapsulant layer, and wherein the solar shell further includes an inner encapsulant layer that is between the outer encapsulant layer and the solar cell and that at least partially encapsulates the solar cell, wherein the inner encapsulant layer has a permeability to moisture of less than 0.1 grams per square meter per day.

20. The solar shell of claim 16, wherein the photovoltaic material includes perovskite.

21. The solar shell of claim 16, further comprising a mating feature to engage with a battery cap of the modular solar battery to enable the rechargeable battery to be removed from the open interior region.

22. The solar shell of claim 16, wherein the three-dimensional shape of the solar shell is a cylindrical shape, and wherein the solar shell includes a top opening for a modular solar battery (MSB) anode and a bottom opening for a MSB cathode.

23. A photovoltaic cell comprising:
an anode including:
a base layer of graphene;
a monolayer on the base layer, wherein the monolayer includes a single atomic layer of tin, or a single molecular layer of praseodymium cerium copper oxide (PrCeCuO), or a single molecular layer of $Pr_{2-x}Ce_xCuO_4$, wherein x is a non-zero value;
a photovoltaic material on the monolayer of the anode; and
a cathode on the photovoltaic material.

24. The photovoltaic cell of claim 23, wherein the anode has a three-dimensional shape.

25. The photovoltaic cell of claim 24, wherein the three-dimensional shape is an open cylindrical shape, an open rectangular shape, or a curved planar shape.

26. The photovoltaic cell of claim 23, wherein the photovoltaic material is perovskite.

27. The photovoltaic cell of claim 23, further comprising:
a first encapsulant layer that surrounds the solar cell, wherein the first encapsulant layer has a permeability to moisture of less than 0.1 grams per square meter per day; and
a second encapsulant layer that surrounds the first encapsulant layer and the solar cell.

28. The photovoltaic cell of claim 23, wherein the photovoltaic cell is included in a solar shell of a modular solar battery.

29. A modular solar battery, comprising:
a solar shell including a solar cell, wherein the solar shell has a three-dimensional shape with an open interior region;
a rechargeable battery to be disposed in the open interior region, the rechargeable battery to be charged by the solar cell;
a modular solar battery (MSB) anode and an MSB cathode coupled to the rechargeable battery to provide electrical energy from the rechargeable battery to an electronic device; and
a battery cap coupled to the solar shell, wherein the battery cap is at least partially removable from the solar shell to enable removal of the rechargeable battery from the open interior region;
wherein the solar cell includes a solar cell anode, a photovoltaic material coupled to the solar cell anode, and a solar cell cathode coupled to the photovoltaic material, wherein the solar cell anode faces the open interior region of the solar cell; and
wherein the solar cell anode includes:
a first layer of graphene; and
a second layer on the first layer, wherein the second layer includes tin, praseodymium cerium copper oxide (PrCeCuO), or $Pr_{2-x}Ce_xCuO_4$, wherein x is a non-zero value.

30. A modular solar battery, comprising:
a solar shell including a solar cell, wherein the solar shell has a three-dimensional shape with an open interior region;
a rechargeable battery to be disposed in the open interior region, the rechargeable battery to be charged by the solar cell;
a modular solar battery (MSB) anode and an MSB cathode coupled to the rechargeable battery to provide electrical energy from the rechargeable battery to an electronic device; and
a battery cap coupled to the solar shell, wherein the battery cap is at least partially removable from the solar shell to enable removal of the rechargeable battery from the open interior region;
wherein the solar cell includes a solar cell anode, a photovoltaic material coupled to the solar cell anode, and a solar cell cathode coupled to the photovoltaic material, wherein the solar cell anode faces the open interior region of the solar cell; and
wherein the solar cell anode includes:
a first layer; and
a second layer coupled with the first layer;
wherein the first layer includes germanene and the second layer includes molybdenum disulfide, or the first layer includes silicene and the second layer includes silver.

31. A modular solar battery, comprising:
a solar shell including a solar cell, wherein the solar shell has a three-dimensional shape with an open interior region;
a rechargeable battery to be disposed in the open interior region, the rechargeable battery to be charged by the solar cell;
a modular solar battery (MSB) anode and an MSB cathode coupled to the rechargeable battery to provide electrical energy from the rechargeable battery to an electronic device; and
a battery cap coupled to the solar shell, wherein the battery cap is at least partially removable from the solar shell to enable removal of the rechargeable battery from the open interior region;

wherein the solar cell includes a solar cell anode, a photovoltaic material coupled to the solar cell anode, and a solar cell cathode coupled to the photovoltaic material, wherein the solar cell anode faces the open interior region of the solar cell; and wherein the solar shell includes a first encapsulant layer that surrounds the solar cell and a second encapsulant layer that surrounds the first encapsulant layer and the solar cell, wherein the first encapsulant layer has a permeability to moisture of less than 0.1 grams per square meter per day.

32. A modular solar battery, comprising:
    a solar shell including a solar cell, wherein the solar shell has a three-dimensional shape with an open interior region;
    a rechargeable battery to be disposed in the open interior region, the rechargeable battery to be charged by the solar cell;
    a modular solar battery (MSB) anode and an MSB cathode coupled to the rechargeable battery to provide electrical energy from the rechargeable battery to an electronic device; and
    a battery cap coupled to the solar shell, wherein the battery cap is at least partially removable from the solar shell to enable removal of the rechargeable battery from the open interior region;
    wherein the battery has a battery anode that includes:
        a first layer; and
        a second layer coupled with the first layer, wherein:
            the first layer includes graphene and the second layer includes tin, praseodymium cerium copper oxide (PrCeCuO), or $Pr_{2-x}Ce_xCuO_4$, wherein x is a non-zero value;
            the first layer includes germanene and the second layer includes molybdenum disulfide; or
            the first layer includes silicene and the second layer includes silver.

33. A solar shell for a modular solar battery, the solar shell comprising:
    a solar cell including:
        a solar cell anode;
        a photovoltaic material coupled to the solar cell anode; and
        a solar cell cathode coupled to the photovoltaic material;
    an encapsulant layer that at least partially encapsulates the solar cell and that forms an outside surface of the solar shell, wherein the solar shell has a three-dimensional shape with an open interior region that is to house a rechargeable battery; and
    an anode contact coupled to the solar cell anode to conductively couple the solar cell anode to the rechargeable battery to charge the rechargeable battery;
    wherein the solar cell anode includes:
        a first layer; and
        a second layer coupled with the first layer;
        wherein:
            the first layer includes graphene and the second layer includes tin, praseodymium cerium copper oxide (PrCeCuO), or $Pr_{2-x}Ce_xCuO_4$, wherein x is a non-zero value;
            the first layer includes germanene and the second layer includes molybdenum disulfide; or
            the first layer includes silicene, phosphorene, or borophene, and the second layer includes silver.

34. A solar shell for a modular solar battery, the solar shell comprising:
    a solar cell including:
        a solar cell anode;
        a photovoltaic material coupled to the solar cell anode; and
        a solar cell cathode coupled to the photovoltaic material;
    an outer encapsulant layer that at least partially encapsulates the solar cell and that forms an outside surface of the solar shell, wherein the solar shell has a three-dimensional shape with an open interior region that is to house a rechargeable battery;
    an inner encapsulant layer that is between the outer encapsulant layer and the solar cell and that at least partially encapsulates the solar cell, wherein the inner encapsulant layer has a permeability to moisture of less than 0.1 grams per square meter per day; and
    an anode contact coupled to the solar cell anode to conductively couple the solar cell anode to the rechargeable battery to charge the rechargeable battery.

* * * * *